US012640181B2

(12) United States Patent
Bozdag et al.

(10) Patent No.: US 12,640,181 B2
(45) Date of Patent: May 26, 2026

(54) LOW ERROR RATE READ OPERATION IN MULTI-MODULE ARRAYS

(71) Applicant: Sandisk Technologies, Inc., Milpitas, CA (US)

(72) Inventors: Kadriye Deniz Bozdag, Sunnyvale, CA (US); Juan Saenz, Menlo Park, CA (US); Mark Lin, Santa Clara, CA (US); Dimitri Houssameddine, Sunnyvale, CA (US); Mario Laudato, Santa Clara, CA (US); Nicolas Irizarry, Folsom, CA (US); Ashraf B. Islam, El Dorado Hills, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 156 days.

(21) Appl. No.: 18/591,904

(22) Filed: Feb. 29, 2024

(65) Prior Publication Data

US 2025/0279127 A1     Sep. 4, 2025

(51) Int. Cl.
*G11C 11/16*          (2006.01)
*G11C 5/14*           (2006.01)

(52) U.S. Cl.
CPC .......... *G11C 11/1677* (2013.01); *G11C 5/147* (2013.01); *G11C 11/1673* (2013.01)

(58) Field of Classification Search
CPC . G11C 11/1677; G11C 11/1673; G11C 5/147; G11C 2013/0054; G11C 13/004
See application file for complete search history.

(56) References Cited

U.S. PATENT DOCUMENTS

| | | | |
|---|---|---|---|
| 7,218,570 | B2 | 5/2007 | So et al. |
| 7,286,429 | B1 | 10/2007 | Liaw et al. |
| 8,498,146 | B2 | 7/2013 | Sekar et al. |
| 8,509,003 | B2 | 8/2013 | Lin et al. |
| 8,750,018 | B2 | 6/2014 | Youn et al. |
| 8,885,428 | B2 | 11/2014 | Chen et al. |
| 8,934,295 | B1 | 1/2015 | Chen et al. |
| 8,996,793 | B1 | 3/2015 | Steiner et al. |
| 9,025,364 | B2 | 5/2015 | Kinney et al. |
| 9,299,411 | B2 | 3/2016 | Alam et al. |
| 9,390,779 | B2 | 7/2016 | Jung et al. |
| 9,697,880 | B2 | 7/2017 | Andre et al. |
| 10,026,478 | B1 | 7/2018 | Choi et al. |
| 10,394,652 | B2 | 8/2019 | Choi et al. |

(Continued)

OTHER PUBLICATIONS

Chiu et al., "A differential 2R crosspoint RRAM array with zero standby current," IEEE Transactions on Circuits and Systems II: Express Briefs 62.5, Retrieved May 10, 2025, pp. 461-465.

(Continued)

*Primary Examiner* — Sultana Begum
(74) *Attorney, Agent, or Firm* — Pearl Cohen Zedek Latzer Baratz LLP

(57)          ABSTRACT

Technology for reading memory cells in a cross-point architecture. A memory system reads one memory cell in each module in parallel. The memory system performs two reads of the memory cells with a first read using a first reference signal and a second read using a second reference signal instead of the first reference signal. The second reference signal has a different magnitude from the first reference signal in order to compensate for differences between the modules.

15 Claims, 25 Drawing Sheets

(56) References Cited

U.S. PATENT DOCUMENTS

| | | | |
|---|---|---|---|
| 10,585,735 B2 | 3/2020 | Kinney et al. | |
| 10,770,137 B2 | 9/2020 | Gangasani | |
| 10,818,343 B2 | 10/2020 | Raad et al. | |
| 11,037,621 B2 | 6/2021 | Raad et al. | |
| 12,431,215 B2 * | 9/2025 | Chang | G11C 29/52 |
| 2008/0205119 A1 | 8/2008 | Nagai et al. | |
| 2010/0290294 A1 | 11/2010 | Siau | |
| 2020/0234761 A1 | 7/2020 | Bedeschi et al. | |
| 2020/0303005 A1 | 9/2020 | Chevallier et al. | |
| 2021/0181979 A1 * | 6/2021 | Choi | G06F 3/0604 |
| 2021/0271416 A1 | 9/2021 | Alhussien et al. | |
| 2022/0108753 A1 | 4/2022 | He et al. | |
| 2022/0208262 A1 | 6/2022 | Mirichigni et al. | |
| 2022/0415387 A1 | 12/2022 | Franklin et al. | |
| 2023/0005530 A1 | 1/2023 | Franklin et al. | |
| 2023/0359301 A1 | 11/2023 | Ostrand et al. | |
| 2023/0386543 A1 | 11/2023 | Tran et al. | |
| 2024/0127897 A1 * | 4/2024 | Lee | G11C 16/0433 |

OTHER PUBLICATIONS

International Search Report & The Written Opinion of the International Searching Authority dated Jun. 5, 2025, International Application No. PCT/US2025/010839.
U.S. Appl. No. 18/355,368, filed Jul. 19, 2023.

* cited by examiner

Figure 1B:
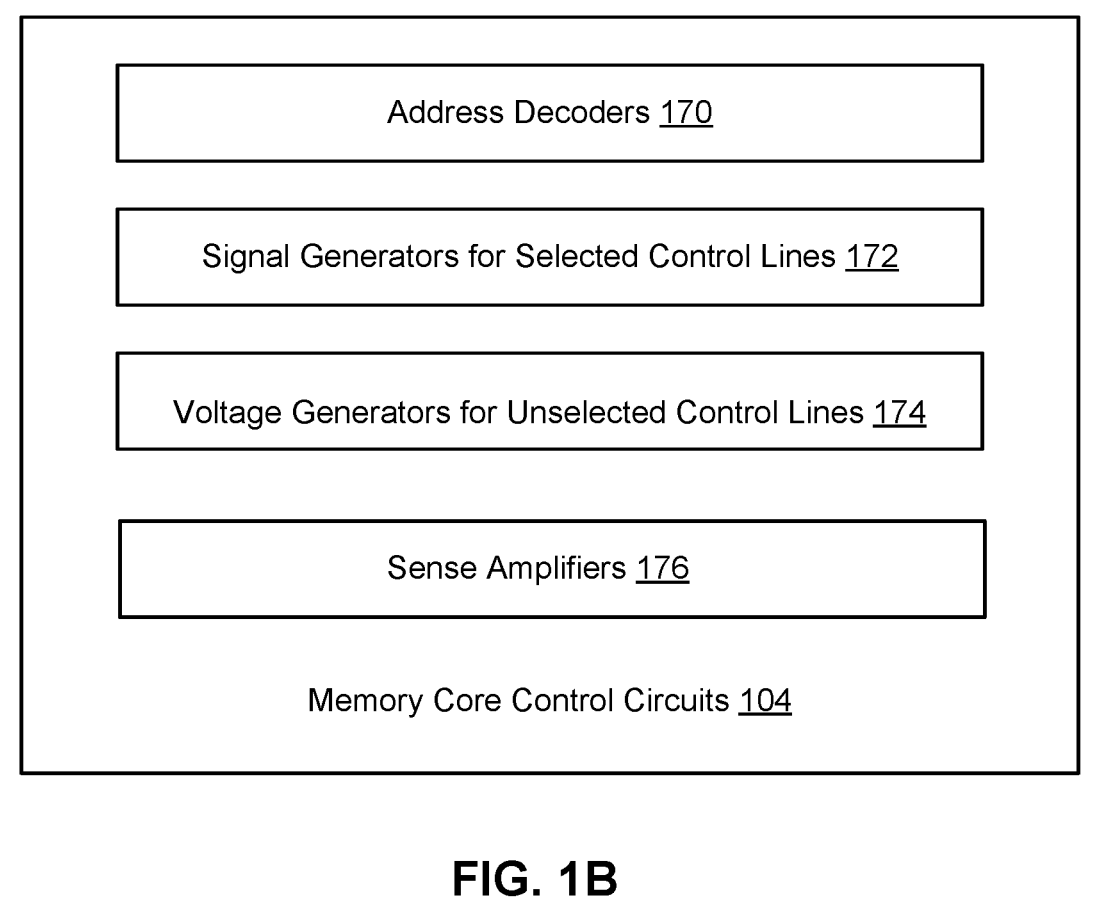

Address Decoders 170

Signal Generators for Selected Control Lines 172

Voltage Generators for Unselected Control Lines 174

Sense Amplifiers 176

Memory Core Control Circuits 104

Figure 3A:
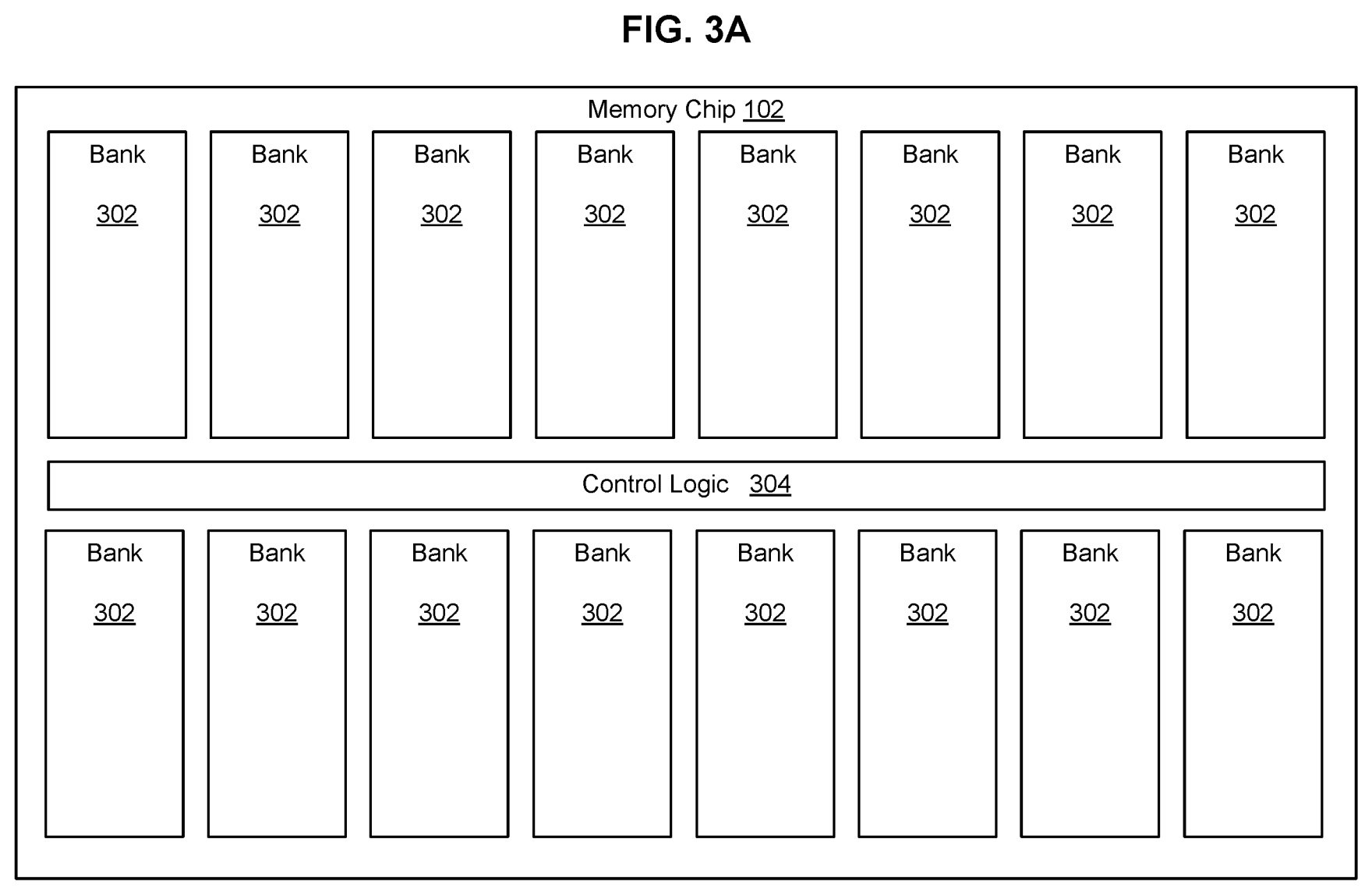

Memory Chip 102

| Bank 302 | Bank 302 | Bank 302 | Bank 302 | Bank 302 | Bank 302 | Bank 302 | Bank 302 |

Control Logic 304

| Bank 302 | Bank 302 | Bank 302 | Bank 302 | Bank 302 | Bank 302 | Bank 302 | Bank 302 |

FIG. 3C

Module  310

Tile

320

Tile

320

Tile

320

Tile

1100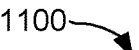

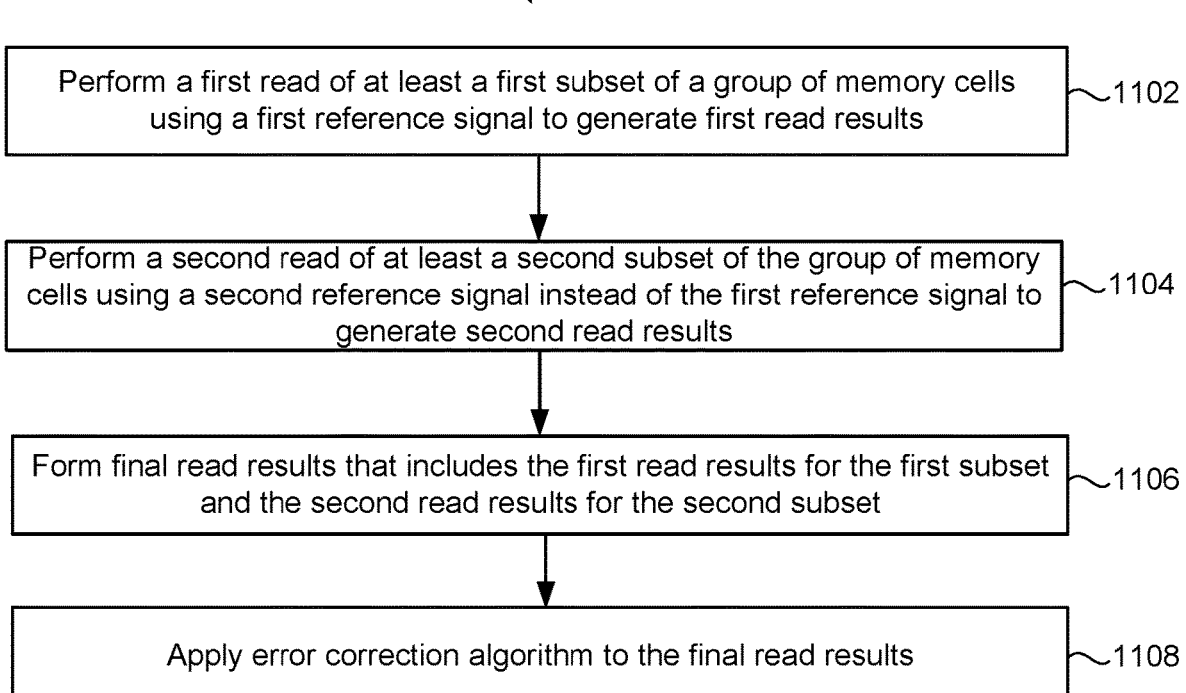

Perform a first read of at least a first subset of a group of memory cells using a first reference signal to generate first read results ~1102

Perform a second read of at least a second subset of the group of memory cells using a second reference signal instead of the first reference signal to generate second read results ~1104

Form final read results that includes the first read results for the first subset and the second read results for the second subset ~1106

Apply error correction algorithm to the final read results ~1108

FIG. 12

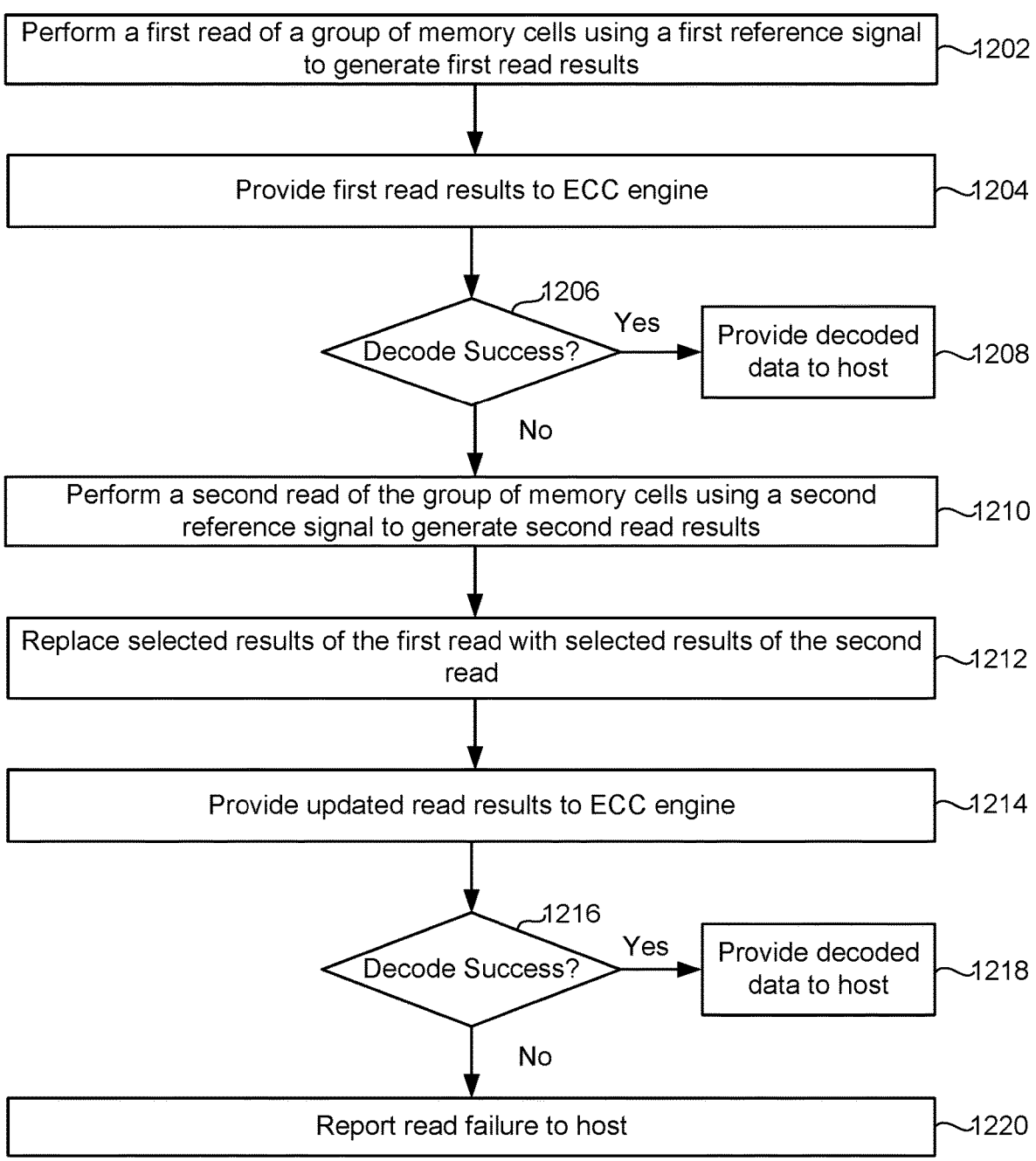

1200

Perform a first read of a group of memory cells using a first reference signal to generate first read results ⌐1202

Provide first read results to ECC engine ⌐1204

1206
Decode Success?   Yes → Provide decoded data to host ⌐1208

No

Perform a second read of the group of memory cells using a second reference signal to generate second read results ⌐1210

Replace selected results of the first read with selected results of the second read ⌐1212

Provide updated read results to ECC engine ⌐1214

1216
Decode Success?   Yes → Provide decoded data to host ⌐1218

No

Report read failure to host ⌐1220

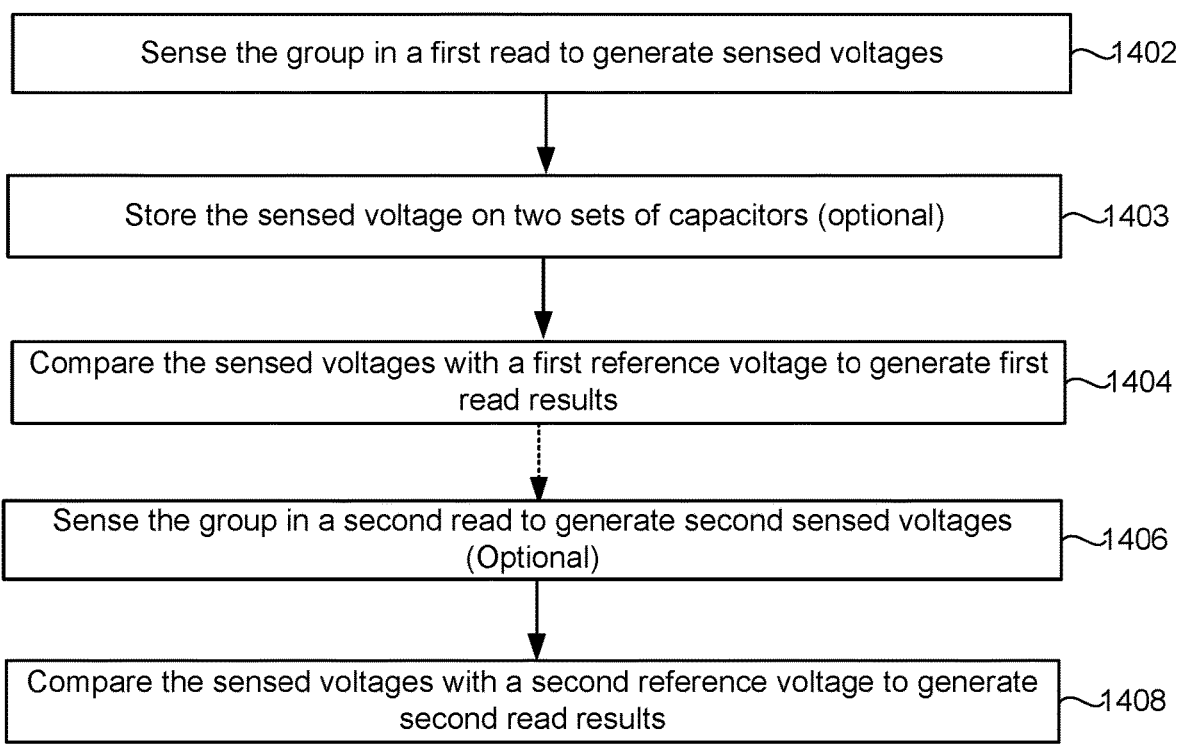

Sense the group in a first read to generate sensed voltages ~1402

Store the sensed voltage on two sets of capacitors (optional) ~1403

Compare the sensed voltages with a first reference voltage to generate first read results ~1404

Sense the group in a second read to generate second sensed voltages (Optional) ~1406

Compare the sensed voltages with a second reference voltage to generate second read results ~1408

1420

Force read current through memory cells ⟞1422

Sense voltages in response to forced current ⟞1424

Compare sensed voltage with first reference voltage to generate first read results ⟞1426

Force the read current through memory cells ⟞1428

Sense voltages in response to forced current ⟞1430

Compare sensed voltage with second reference voltage to generate second read results ⟞1432

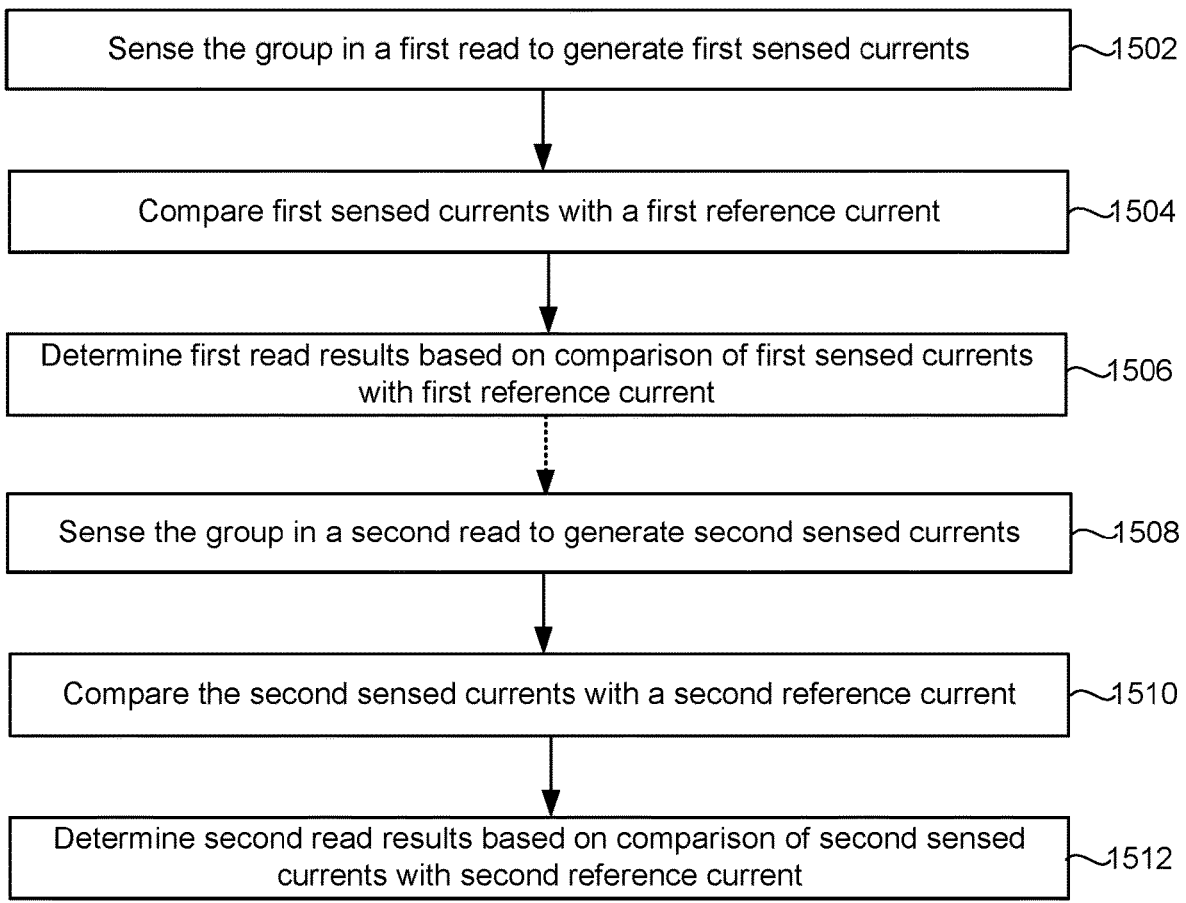

1500

Sense the group in a first read to generate first sensed currents    1502

Compare first sensed currents with a first reference current    1504

Determine first read results based on comparison of first sensed currents with first reference current    1506

Sense the group in a second read to generate second sensed currents    1508

Compare the second sensed currents with a second reference current    1510

Determine second read results based on comparison of second sensed currents with second reference current    1512

FIG. 16

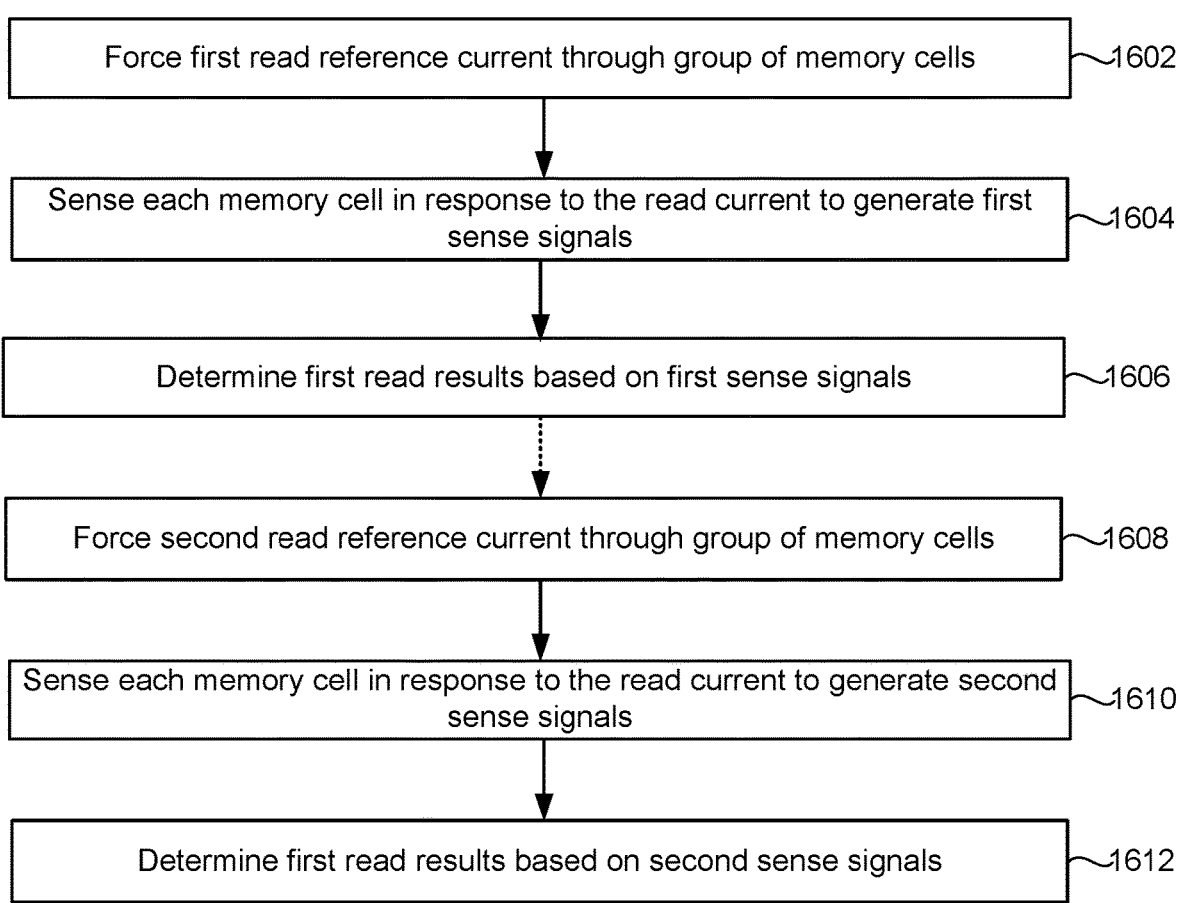

1600

Force first read reference current through group of memory cells ~1602

Sense each memory cell in response to the read current to generate first sense signals ~1604

Determine first read results based on first sense signals ~1606

Force second read reference current through group of memory cells ~1608

Sense each memory cell in response to the read current to generate second sense signals ~1610

Determine first read results based on second sense signals ~1612

FIG. 17

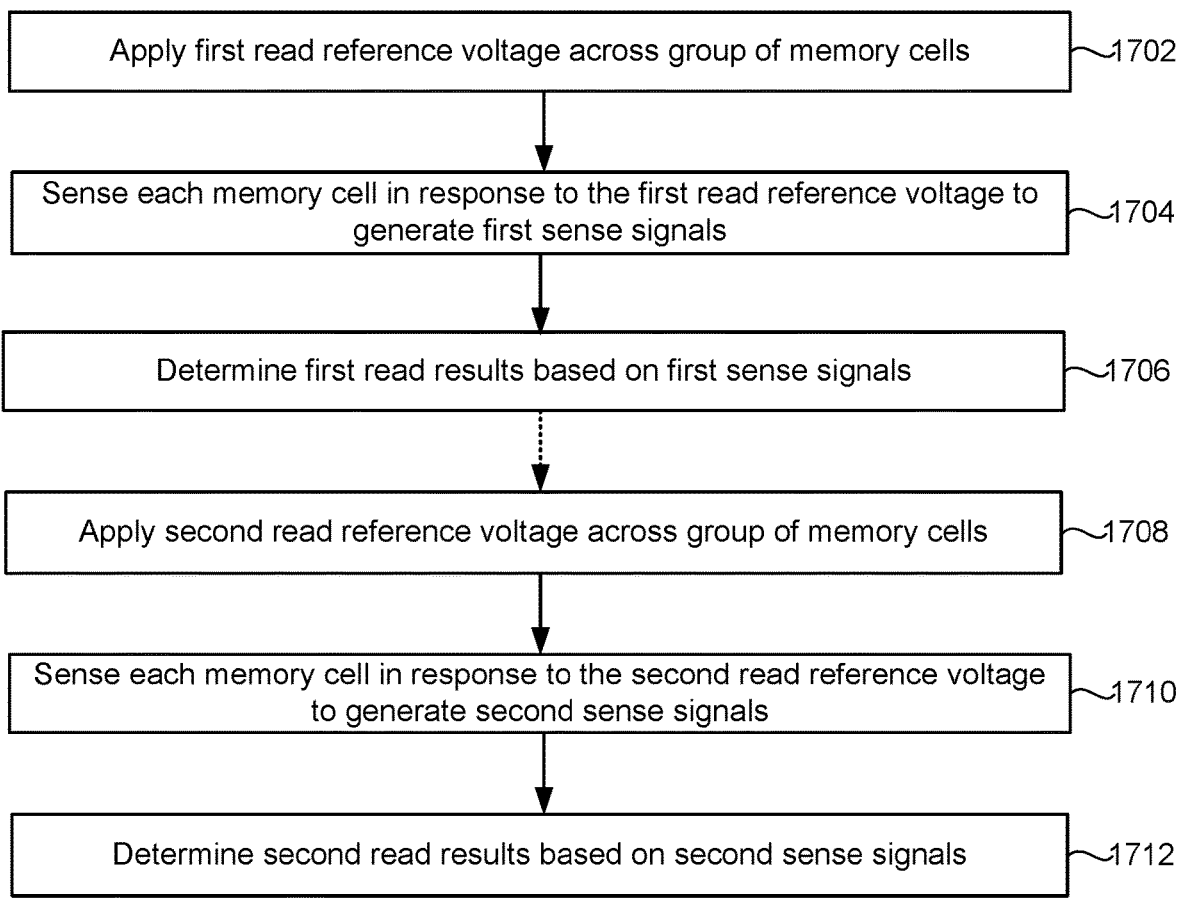

1700

Apply first read reference voltage across group of memory cells  ～1702

Sense each memory cell in response to the first read reference voltage to generate first sense signals  ～1704

Determine first read results based on first sense signals  ～1706

Apply second read reference voltage across group of memory cells  ～1708

Sense each memory cell in response to the second read reference voltage to generate second sense signals  ～1710

Determine second read results based on second sense signals  ～1712

LOW ERROR RATE READ OPERATION IN MULTI-MODULE ARRAYS

BACKGROUND

Memory is widely used in various electronic devices such as cellular telephones, digital cameras, personal digital assistants, medical electronics, mobile computing devices, non-mobile computing devices, and data servers. Memory may comprise non-volatile memory or volatile memory. A non-volatile memory allows information to be stored and retained even when the non-volatile memory is not connected to a source of power (e.g., a battery). Non-volatile memory can be made to appear non-volatile at least for a limited time by, external to the memory chip, adding battery back to the power supply.

The memory cells may reside in a cross-point memory array. In a memory array with a cross-point type architecture, one set of conductive lines run across the surface of a substrate and another set of conductive lines are formed above the other set of conductive lines running in an orthogonal direction relative to the initial layer. The memory cells are located at the cross-point junctions of the two sets of conductive lines.

A programmable resistance memory cell is formed from a material having a programmable resistance. In a binary approach, the programmable resistance memory cell can be programmed into one of two resistance states: high resistance state (HRS) and low resistance state (LRS). In some approaches, more than two resistance states may be used. One type of programmable resistance memory cell is a magnetoresistive random access memory (MRAM) cell. An MRAM cell uses magnetization to represent stored data, in contrast to some other memory technologies that use electronic charges (DRAM) or voltages (SRAM) to store data. A bit of data is written to an MRAM cell by changing the direction of magnetization of a magnetic element ("the free layer") within the MRAM cell, and a bit is read by measuring the resistance of the MRAM cell, such resistance changing with the direction of magnetization. However, the cross-point memory array may have other types of memory cells. For example, the cross-point memory array may have memory cell of other technologies such as ReRam, PCM (Phase Change Memory), or FeRam.

BRIEF DESCRIPTION OF THE DRAWINGS

FIG. 1B depicts one embodiment of memory core control circuits.

FIG. 3A depicts one embodiment of a memory die having a number of banks.

FIG. 3C depicts one embodiment of a module having a four tiles.

FIG. 11 is a flowchart of one embodiment of a process of reading memory cells in cross-point memory arrays.

FIG. 12 is a flowchart of one embodiment of a process of reading programmable resistance memory cells in cross-point arrays where a second read is performed in response to a decode failure.

FIG. 14 is a flowchart of one embodiment of a process of reading memory cells that includes two reads with different reference voltages.

FIG. 15 is a flowchart of one embodiment of a process of reading memory cells two reads with different reference currents.

FIG. 16 is a flowchart of one embodiment of a process of reading memory cells that includes two read with different read reference currents.

FIG. 17 is a flowchart of one embodiment of a process of reading memory cells that includes two read with different read reference voltages.

DETAILED DESCRIPTION

Figure 1A:
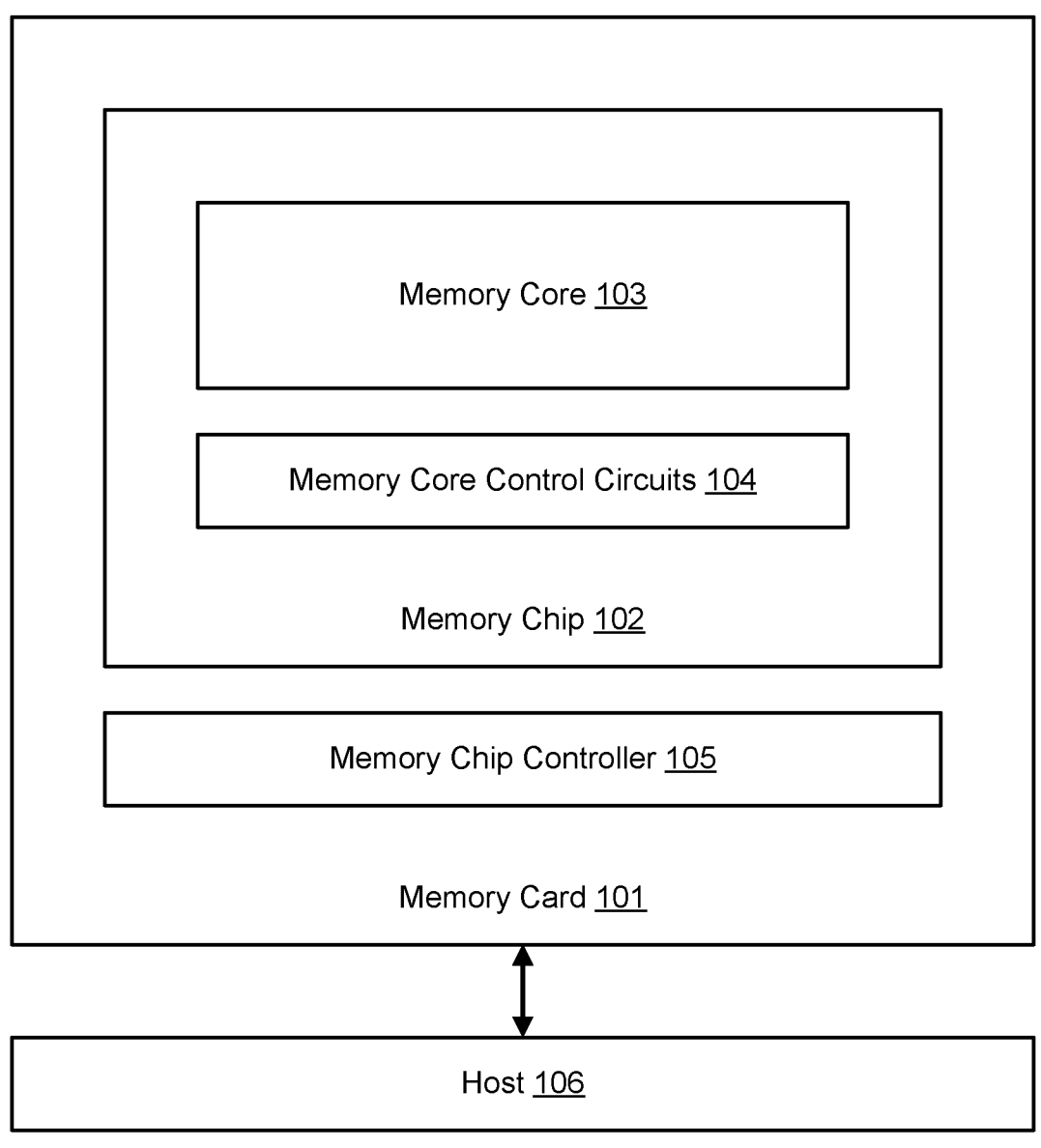
FIG. 1A depicts one embodiment of a memory system.

Technology is described for reading memory cells in a cross-point architecture. In an embodiment, a memory system has a number of modules, each module with one or more cross-point memory arrays and control circuits. The control circuits could include sense amplifiers, address decoders, voltage drivers, current drivers, current mirrors, transistors, etc. There could be some variance between the control circuits in the different modules that could impact read accuracy. In an embodiment, the memory system reads one memory cell in each module in parallel. The memory cells selected for read may store one or more ECC codewords. To provide for a more accurate read, the memory system may perform two reads of the memory cells with a first read using a first reference signal and a second read using a second reference signal instead of the first reference signal. The second reference signal has a different magnitude from the first reference signal in order to compensate for differences between the modules. Moreover, this technique does not require storage of the read parameters within the modules. There may be a limited amount of storage for trim settings (e.g., the magnitude of the reference signal) within a module. Therefore, it is not required that each module store the optimal values of the reference signal for that module. Instead, in an embodiment, the optimal values of the reference signal for each module may be stored external to the modules.

In one embodiment, the first and second reference signals are used as comparison signals. In an embodiment, the memory cells are sensed to generate first sense voltages that are compared with a first reference voltage to generate first read results. The memory cells are sensed again to generate second sense voltages that are compared with a second reference voltages to generate second read results. The memory system forms final read results from the first read results for a first set of the memory cells and from the second read results for a second set of the memory cells.

In an embodiment, the memory cells are sensed to generate first sense currents that are compared with a first reference current. First read results are determined based on the comparison of the first sense currents with the first reference current. The memory cells are sensed to generate second sense currents that are compared with a second reference current. Second read results are determined based on the comparison of the second sense currents with the second reference current. The memory system forms final read results from the first read results for a first set of the memory cells and from the second read results for a second set of the memory cells.

In one embodiment, the first and second reference signals are applied to the memory cells. In an embodiment, the first reference signal is applied to the memory cells to generate first sense signals. First read results are determined based on the first sense signals. The second reference signal is applied to the memory cells to generate second sense signals. Second read results are determined based on the second sense signals. The memory system forms final read results from the first read results for a first set of the memory cells and from the second read results for a second set of the memory cells. In one embodiment, the first and second reference signals are reference voltages that are applied across the memory cells. In one embodiment, the first and second reference signals are reference currents that forced through the memory cells.

In some embodiments, the memory cells are in a cross-point array and are magnetoresistive random access memory (MRAM) cells. An MRAM cell uses magnetization to represent stored data, in contrast to some other memory technologies that use electronic charges to store data. A bit of data is written to an MRAM cell by changing the direction of magnetization of a magnetic element ("the free layer") within the MRAM cell, and a bit is read by measuring the resistance of the MRAM cell (low resistance typically represents a "0" bit and high resistance typically represents a "1" bit). As used herein, direction of magnetization is the direction that the magnetic moment is oriented with respect to a reference direction set by another element of the MRAM ("the reference layer"). In some embodiments, the low resistance is referred to as a parallel or P-state and the high resistance is referred to as an anti-parallel or AP-state. MRAM can use the spin-transfer torque effect to change the direction of the magnetization from P-state to AP-state and vice-versa, which typically requires bipolar (bi-directional write) operation for writes.

FIG. 1A depicts one embodiment of a memory system 100. Memory system 100 includes a host 106 (e.g., a personal computer or mobile computing device) and a memory card 101. The memory card 101 includes a memory chip controller 105 and a memory chip 102 (also referred to as "memory die"). Herein the term "apparatus" may include, but is not limited to, memory system 100, memory card 101, or memory chip (or die) 102. The memory chip controller 105 may include one or more state machines, page registers, SRAM, or other control logic for controlling the operation of memory chip 102. The one or more state machines, page registers, SRAM, and/or other control logic for controlling the operation of the memory chip may be referred to as managing or control circuits for facilitating one or more memory array operations including erasing, programming, or reading operations. The memory chip controller may receive data and commands from host 106 and provides memory chip data to host 106.

In one embodiment, the memory chip controller 105 and memory chip 102 may be arranged on a single integrated circuit. In other embodiments, memory chip controller 105 and memory chip 102 may be arranged on different integrated circuits. The memory chip 102 includes memory core control circuits 104 and a memory core 103. Memory core control circuits 104 may include logic for controlling the selection of memory blocks (or arrays) within memory core 103, controlling the generation of voltage references for biasing a particular memory array into a read or write state, or generating row and column addresses. The memory core 103 may include one or more two-dimensional arrays of memory cells or one or more three-dimensional arrays of memory cells. In one embodiment, the memory core control circuits 104 and memory core 103 are arranged on a single integrated circuit. In other embodiments, the memory core control circuits 104 and memory core 103 are arranged on different integrated circuits.

Referring to FIG. 1A, a memory card operation may be initiated when host 106 sends instructions to memory chip controller 105 indicating that it would like to read data from memory card 101 or write data to memory card 101. In the event of a write (or programming) operation, host 106 will send to memory chip controller 105 both a write command and the data to be written. The data to be written may be buffered by memory chip controller 105 and error correcting code (ECC) data may be generated corresponding with the data to be written. The ECC data, which allows data errors that occur during transmission or storage to be detected and/or corrected, may be written to memory core 103 or stored in non-volatile memory within memory chip controller 105. In one embodiment, the ECC data is generated and data errors are corrected by circuitry within memory chip controller 105.

As depicted in FIG. 1A, the operation of memory chip 102 may be controlled by memory chip controller 105. In one example, before issuing a write operation to memory chip 102, memory chip controller 105 may check a status register to make sure that memory chip 102 is able to accept the data to be written. In another example, before issuing a read operation to memory chip 102, memory chip controller 105 may pre-read overhead information associated with the data to be read. The overhead information may include ECC data associated with the data to be read or a redirection pointer to a new memory location within memory chip 102 in which to read the data requested. Once a read or write operation is initiated by memory chip controller 105, memory core control circuits 104 may generate the appropriate bias voltages (and/or currents) for word lines and bit lines within memory core 103, as well as generate the appropriate memory block, row, and column addresses.

FIG. 1B depicts one embodiment of memory core control circuits 104. As depicted, the memory core control circuits 104 include address decoders 170, signal generators for selected control lines 172, voltage generators for unselected control lines 174, and sense amplifiers 176. The signal generators for selected control lines 172 may include voltage generators and/or current generators. In some embodiments, memory cells are read and/or written by forcing a current through the memory cells. In some embodiments, memory cells are read and/or written by applying a voltage across the memory cells. Control lines may include word lines, bit lines, or a combination of word lines and bit lines. Selected control lines may include selected word lines or selected bit lines that are used to place memory cells into a selected state. Unselected control lines may include unselected word lines or unselected bit lines that are used to place memory cells into an unselected state. The signal generators (or signal regulators) for selected control lines 172 may comprise one or more voltage generators for generating selected control line voltages and/or one or more current generators for generating selected control line currents. The voltage generators for unselected control lines 174 may comprise one or more voltage generators for generating unselected control line voltages. Address decoders 170 may generate memory block addresses, as well as row addresses and column addresses for a particular memory block. The sense amplifiers 176 may compare a sensed signal from a memory cell with a reference signal to determine the state of the memory cell. In an embodiment, a sense amplifier 176 determines whether a memory cell is in a high resistance state (HRS) or a low resistance state (LRS). In an embodiment, while a current is driven through the memory cell the voltage across the memory cell is sensed and compared to a reference voltage. In an embodiment, while a voltage is applied across the memory cell the current through the memory cell is sensed and compared to a reference current.

Figure 2:
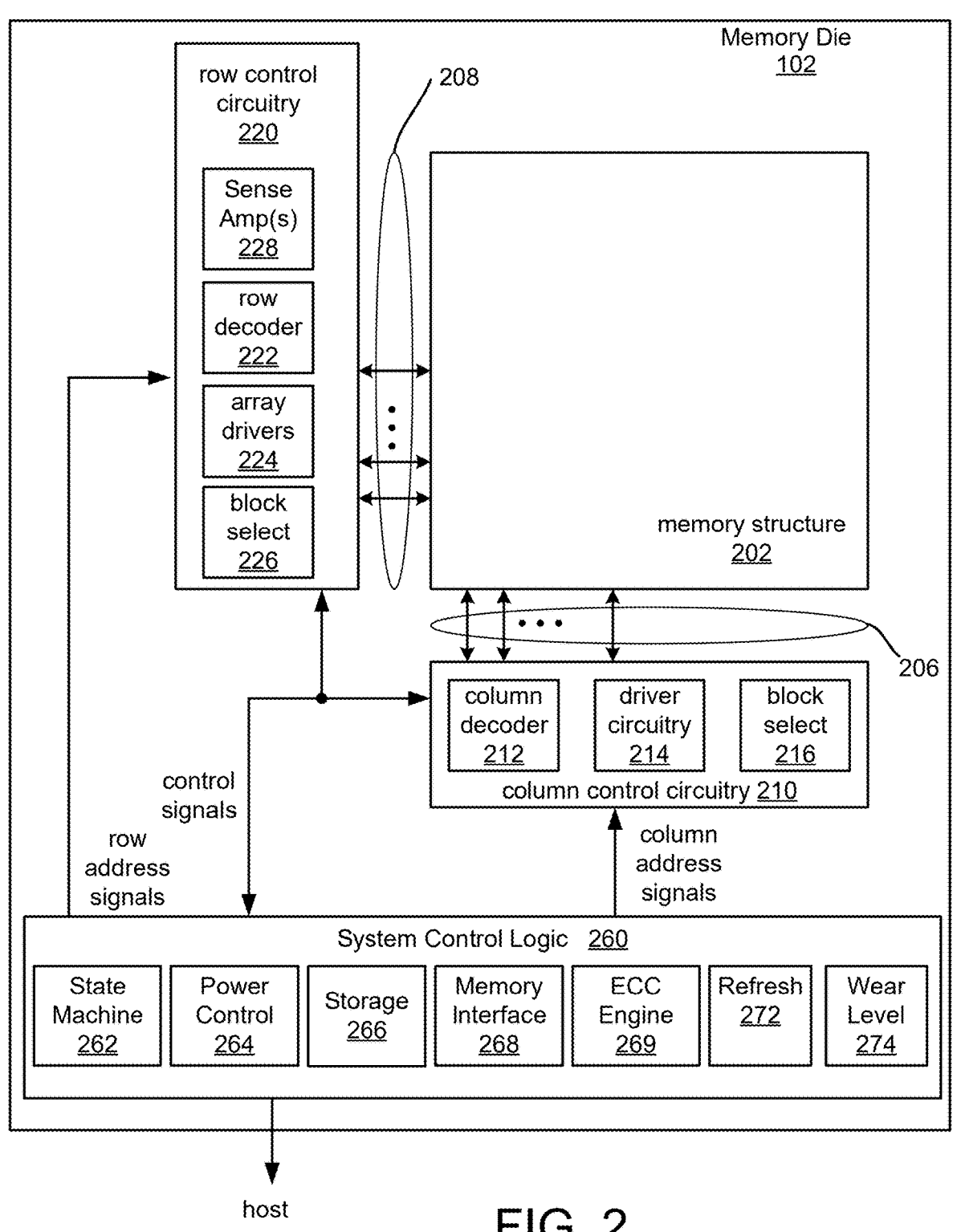
FIG. 2 is a block diagram that depicts one example of a memory die that can implement the technology described herein.

FIG. 2 is a block diagram that depicts one example of a memory die 102 that can implement the technology described herein. In one embodiment, memory die 102 is included in memory card 101. Memory die 102 includes a memory structure 202 that can include any of memory cells described in the following. The memory structure 202 may include one or more memory arrays. The array terminal lines of memory structure 202 include the various layer(s) of word lines organized as rows, and the various layer(s) of bit lines organized as columns. However, other orientations can also be implemented, including for example diagonal patterns to save space. Memory die 102 includes row control circuitry 220, whose outputs 208 are connected to respective word lines of the memory structure 202. Row control circuitry 220 receives a group of M row address signals and one or more various control signals from System Control Logic circuit 260, and typically may include such circuits as row decoders 222, row drivers 224, and block select circuitry 226 for both reading and writing operations. Row control circuitry 220 may also include read/write circuitry. In an embodiment, row decode and control circuitry 220 has sense amplifiers 228, which each contain circuitry for sensing a condition (e.g., voltage, current) of a word line of the memory structure 202. In an embodiment, by sensing a word line voltage, a condition or bit state of a memory cell in a cross-point array is determined by a sense amp comparing the sensed memory cell voltage with a reference voltage. Memory die 102 also includes column decode and control circuitry 210 whose input/outputs 206 are connected to respective bit lines of the memory structure 202. Although only a single block is shown for memory structure 202, a memory die can include multiple arrays or "tiles" that can be individually accessed. Column control circuitry 210 receives a group of N column address signals and one or more various control signals from System Control Logic 260, and typically may include such circuits as column decoders 212, column decoders and drivers 214, block select circuitry 216, as well as read/write circuitry, and I/O multiplexers.

System control logic 260 receives data and commands from a host system and provides output data and status to the host system. In other embodiments, system control logic 260 receives data and commands from a separate controller circuit and provides output data to that controller circuit, with the controller circuit communicating with the host system. Such controller system may implement an interface such as DDR, DIMM, CXL, PCIe and others. In another embodiment those data and commands are sent and received directly from the memory packages to the Host without a separate controller, and any controller needed is within each die or within a die added to a multi-chip memory package. In some embodiments, the system control logic 260 can include a state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor. The system control logic 260 can also include a power control module 264 that controls the power, current source currents, and voltages supplied to the rows and columns of the memory structure 202 during memory operations and may include charge pumps and regulator circuit for creating regulating voltages, and on/off control of each for word line bit line selection of the memory cells. In some embodiments, the power control 264 includes one or more current sources. The current source(s) may be used to provide read and/or write currents. System control logic 260 includes storage 266, which may be used to store parameters for operating the memory structure 202. System control logic 260 also includes refresh logic 272 and wear leveling logic 274. Such system control logic may be commanded by the host 106 or memory controller 105 to refresh logic 272, which may load an on-chip stored row and column address (Pointer) which may be incremented after refresh. Such address bit(s) may be selected only (to refresh the OTS). Or such address may be read, corrected by steering through ECC engine 269, and then stored in a "spare" location, which is also being incremented (so all codewords are periodically read, corrected, and relocated in the entire chip under control of wear leveling logic 274) to in effect wear level so use of each bit across the chip is more uniform. Such operation may be more directly controlled by the host of an external controller, for example a PCIe or CXL or DDRn controller located separately from the memory chip or on the memory die.

Commands and data are transferred between memory controller 105 and the memory die 102 via memory controller interface 268 (also referred to as a "communication interface"). Such interface may be PCIe, CXL, DDRn for example. Memory controller interface 268 is an electrical interface for communicating with memory controller 105. Examples of memory controller interface 268 also include a Toggle Mode Interface. Other I/O interfaces can also be used. For example, memory controller interface 268 may implement a Toggle Mode Interface that connects to a Toggle Mode interfaces of memory controller 105. In one embodiment, memory controller interface 268 includes a set of input and/or output (I/O) pins that connect to the controller 105. In another embodiment, the interface is JEDEC standard DDRn or LPDDRn, such as DDR5 or LPDDR5, or a subset thereof with smaller page and/or relaxed timing.

System control logic 260 may include Error Correction Code (ECC) engine 269. ECC engine 269 may be referred to as an on-die ECC engine, as it is on the same semiconductor die as the memory cells. That is, the on-die ECC engine 269 may be used to encode data and parity bits that are to be stored in the memory structure 202, and to decode the decoded data and correct errors. The encoded data may be referred to herein as a codeword or as an ECC codeword. ECC engine 269 may be used to perform a decoding algorithm and to perform error correction. Hence, the ECC engine 269 may decode the ECC codeword. Having the ECC engine 269 on the same die as the memory cells allows for faster decoding. The ECC engine 269 can use a wide variety of decoding algorithms including, but not limited to, Reed Solomon, a Bose-Chaudhuri-Hocquenghem (BCH), and low-density parity check (LDPC).

In some embodiments, all of the elements of memory die 102, including the system control logic 260, can be formed as part of a single die. In other embodiments, some or all of the system control logic 260 can be formed on a different die; e.g. external controller chip.

In one embodiment, memory structure 202 comprises a three-dimensional memory array of non-volatile or volatile memory cells in which multiple memory levels are formed above a single substrate, such as a wafer. The memory structure may comprise any type of non-volatile or volatile memory that are monolithically formed in one or more physical levels of memory cells having an active area disposed above a silicon or silicon on insulator (or other type of) substrate. In another embodiment, memory structure 202 comprises a two-dimensional memory array of non-volatile memory cells.

The exact type of memory array architecture or memory cell included in memory structure 202 is not limited to the examples above. Many different types of memory array architectures or memory technologies can be used to form memory structure 202. No particular non-volatile memory technology is required for purposes of the newly claimed embodiments proposed herein. Other examples of suitable technologies for memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 202 include two dimensional arrays, three dimensional arrays, cross-point arrays, stacked two dimensional arrays, vertical bit line arrays, and the like.

One example of a ReRAM or MRAM cross-point memory includes programmable resistance switching elements in series with an OTS selector arranged in cross-point arrays accessed by X lines and Y lines (e.g., word lines and bit lines). In another embodiment of cross-point is PCM in series with and OTS selector. In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive random access memory (MRAM) stores data using magnetic storage elements. The elements are formed from two ferromagnetic layers, each of which can hold a magnetization, separated by a thin insulating layer. For a field-controlled MRAM, one of the two layers is a permanent magnet set to a particular polarity; the other layer's magnetization can be changed by applying an external field to store memory. Other types of MRAM cells are possible. A memory device may be built from a grid of MRAM cells or as SOT magneto resistive memory. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). The memory cells are programmed by current pulses that can change the co-ordination of the PCM material or switch it between amorphous and crystalline states. Note that the use of "pulse" in this document does not require a square pulse but includes a (continuous or non-continuous) vibration or burst of sound, current, voltage, light, or other wave. In an embodiment, a phase change memory cell has a phase change memory element in series with a threshold switching selector such as an OTS.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

In an embodiment, a memory die is divided into a hierarchy of banks, modules, and tiles. FIG. 3A depicts one embodiment of a memory die 102 having a number of banks 302. Each bank 302 may have memory cells and control circuitry. The memory cells may be programmable resistance memory cells in cross-pint arrays. There may be additional control logic 304 external to the banks. In this example, there are 16 banks per memory die, but there may be more or fewer than 16 banks per memory die.

Figure 3B:
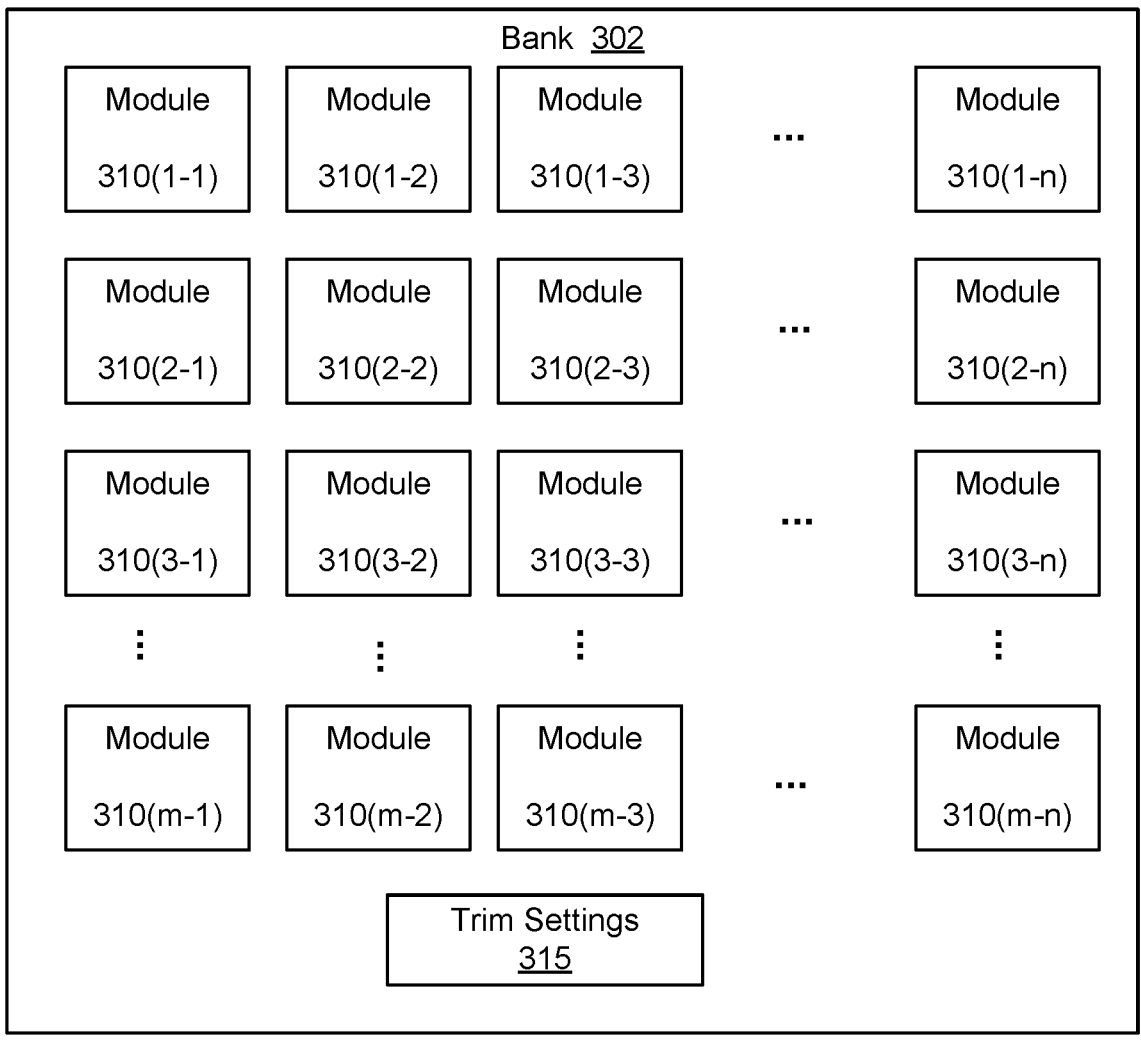
FIG. 3B depicts one embodiment of a bank having a number of modules.

In an embodiment, each bank 302 includes a number of modules. FIG. 3B depicts one embodiment of a bank 302 having a number of modules 310. There are n columns of modules 310 and m rows of modules 310. As one example, n may be 8, where there may be eight columns of modules 310. As one example, m may be 40, where there may be 40 rows of modules. In one embodiment, a read operation will access one memory cell from each module 310 in parallel. In one embodiment, a read will access one or more ECC codewords that includes data bits and parity bits (or check bits). As one example, there may be 256 data bits and 64 parity bits in a read access. Thus, 256 of the modules 310 may be used to store the data bits and 64 of the modules 310 may be used to store the parity bits.

Each module 310 has memory cells and control circuitry. The control circuity may include, but is not limited to, transistors, current mirrors, sense amplifiers, etc. There may be significant variations between the control circuity in the different modules 310, which may impact read accuracy. For example, there may be differences between the transistors, current mirrors, and sense amplifiers in the different modules 310. Due to variations in sense-amps, current mirrors, and other CMOS characteristics, the reference values may vary between modules. During the initial testing of the memory system, the modules 310 may be characterized to determine the optimal read reference setting (voltage or current) for each module 310. Then, these optimal read reference settings are used during read. However, there may be a limited amount of storage for trim settings within a module 310. Therefore, it is not required that each module 310 store the optimal read reference setting for that module 310. Instead, in an embodiment, the optimal read reference settings for each module 310 are store external to the modules 310. The location of these optimal read reference settings per module 310 can vary. In one embodiment, the optimal read reference settings for each module 310 in bank 302 might be stored in trim settings 315 on the bank 302, which is external to the modules 310. In one embodiment, the optimal read reference settings for each module 310 in a die 102 might be stored on the die 102, but external to the banks 302.

Figure 3C:
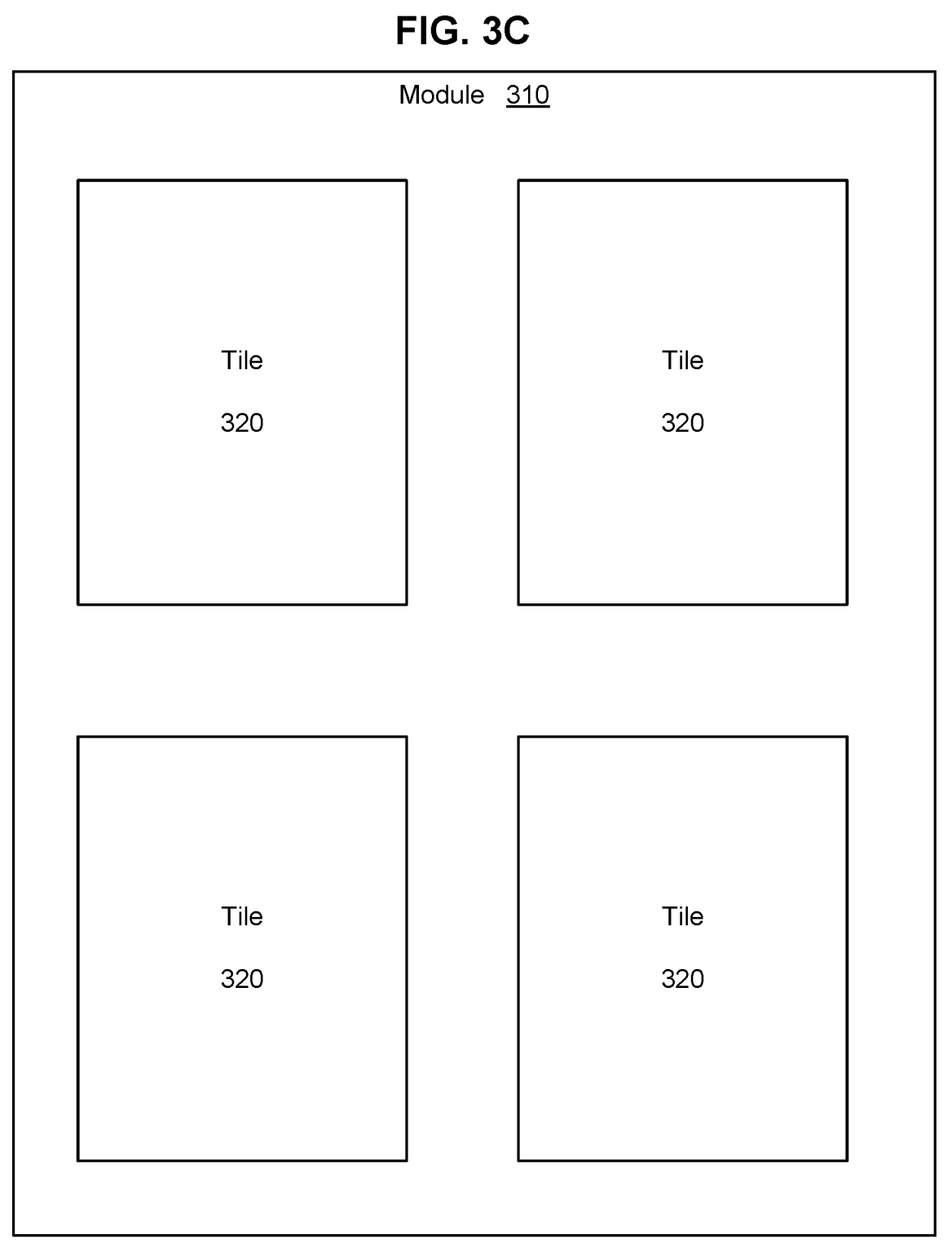

In an embodiment, each module 310 includes a number of tiles. FIG. 3C depicts one embodiment of a module 310 having a four tiles 320. There may be more or fewer than four tiles per module. Each tile 320 has memory cells in a cross-point array and control circuitry. There may be additional control circuitry on the module external to a tile.

Figure 3D:
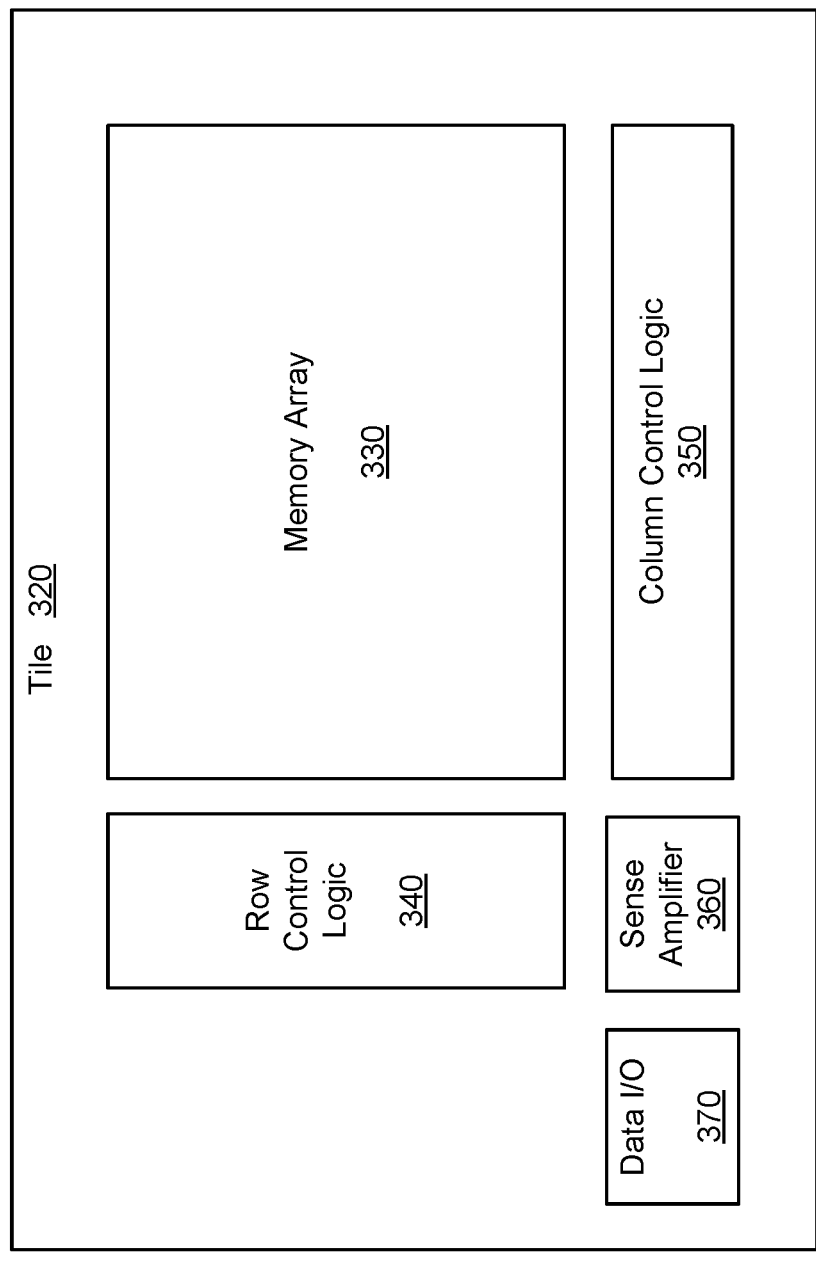
FIG. 3D is a block level diagram of one embodiment of a tile.

FIG. 3D is a block level diagram of one embodiment of a tile 320. The tile 320 has a memory array 330, row control logic 340, column control logic 350, a sense amplifier 360, and data I/O 370. In an embodiment, the memory array 330 contains a cross-point array of memory cells. The row control logic 340 may contain row decoders and row drivers (e.g., voltage and/or current drivers). The column control logic 350 may contain column decoders and column drivers (e.g., voltage and/or current drivers). In one embodiment, the rows are referred to as word lines and the columns are referred to as bit lines.

Figure 4A:
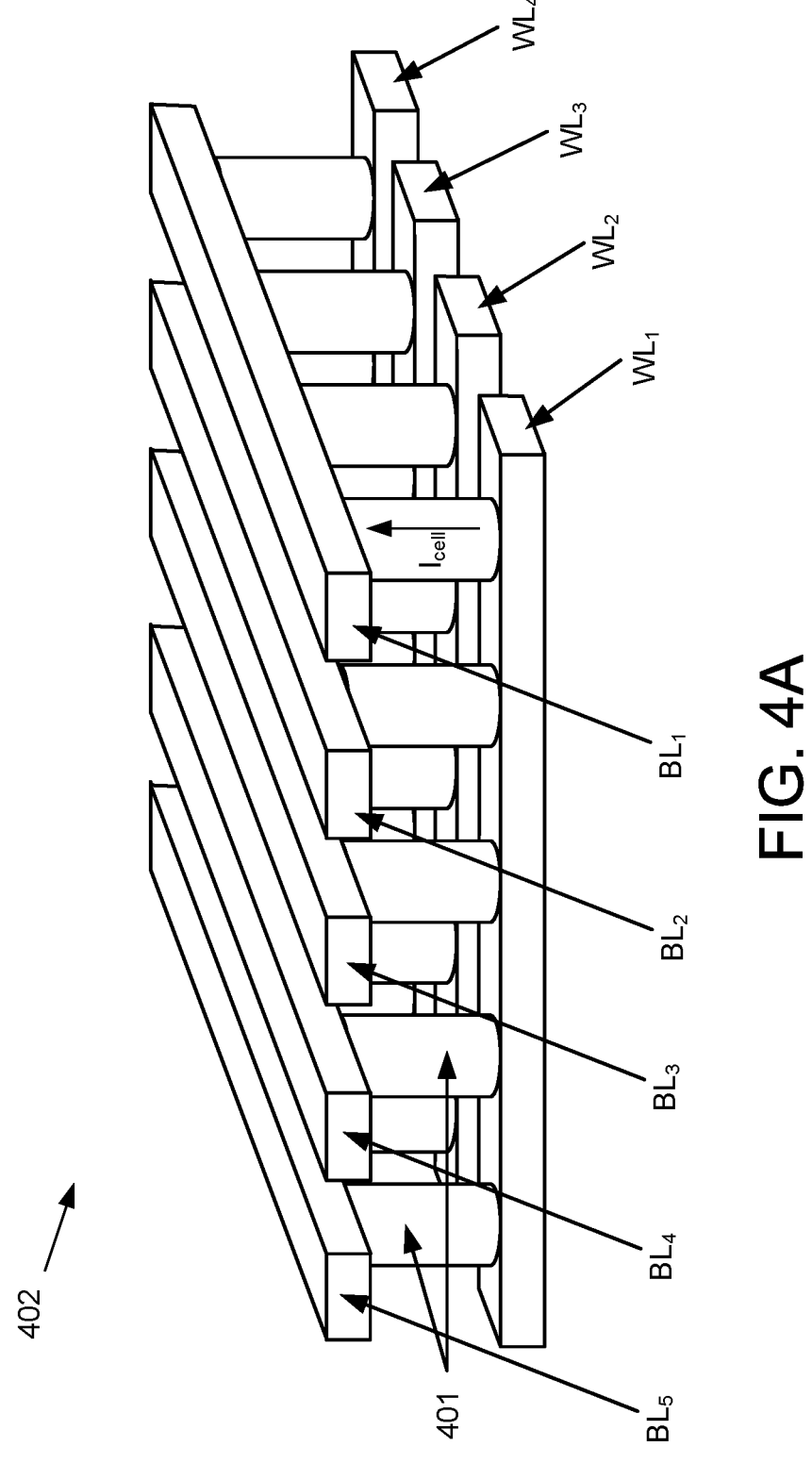
FIG. 4A depicts one embodiment of a portion of a monolithic three-dimensional memory array.

FIG. 4A depicts one embodiment of a portion of a memory array 402 that forms a cross-point architecture in an oblique view. Memory array 402 of FIG. 4A is one example of an implementation for a tile, where a memory die 102 can include multiple such memory arrays 402. In an embodiment, each module 310 of FIG. 3B has one or more memory arrays 402 of FIG. 4A. Memory array 330 in the tile 320 of FIG. 3D may include the cross-point memory array 402 of FIG. 4A. The bit lines $BL_1$-$BL_5$ are arranged in a first direction (represented as running into the page) relative to an underlying substrate (not shown) of the die and the word lines $WL_1$-$WL_5$ are arranged in a second direction perpendicular to the first direction, or diagonal to provide intersections where memory cells are interconnected between WLs and BLs. FIG. 4A is an example of a horizontal cross-point structure in which word lines $WL_1$-$WL_5$ and $BL_1$-$BL_5$ both run in a horizontal direction relative to the substrate, while the memory cells, two of which are indicated at 401, are oriented so that the current through a memory cell (such as shown at $I_{cell}$) runs in the vertical direction. In a memory array with additional layers of memory cells, such as discussed below with respect to FIG. 4D, there would be corresponding additional layers of bit lines and word lines. One pattern, for example, would be from the bottom layer: WL, memory cell, BL, memory cell, WL, WL, memory cell, BL memory cell, WL.

As depicted in FIG. 4A, memory array 402 includes a plurality of memory cells 401. The memory cells 401 may include re-writeable memory elements, such as can be implemented using ReRAM, MRAM, PCM, or other material with a programmable resistance. The memory cells 401 may be referred to herein as programmable resistance memory cells. One type of programmable resistance memory cell is referred to as an MRAM cell, which is a memory cell that includes a MRAM memory element. The memory cells 401 may also include threshold switching selectors as an additional series element within the memory cells 401, such as can be implemented using an Ovonic Threshold Switch (OTS), Volatile Conductive Bridge (VCB), Metal-Insulator-Metal (MIM), or other material that provides a highly non-linear dependence of current or resistance for varying select voltage. The following discussion will focus on memory cells composed of an MRAM memory elements combined in series with an Ovonic Threshold switch elements, although much of the discussion can be applied more generally. The current in the memory cells of the first memory level is shown as flowing upward as indicated by arrow $I_{cell}$, but current can flow in either direction to either read or write the memory cell bit state, as is discussed in more detail in the following.

The cross-point array of FIG. 4A illustrates an embodiment with one layer of word lines and bits lines, with the MRAM or other memory technology for the memory cells sited at the intersection of the two sets of conducting lines. To increase the storage density of a memory die, multiple layers of such memory cells and conductive lines can be formed. A two-layer example is illustrated in FIG. 4B.

Figure 4B:
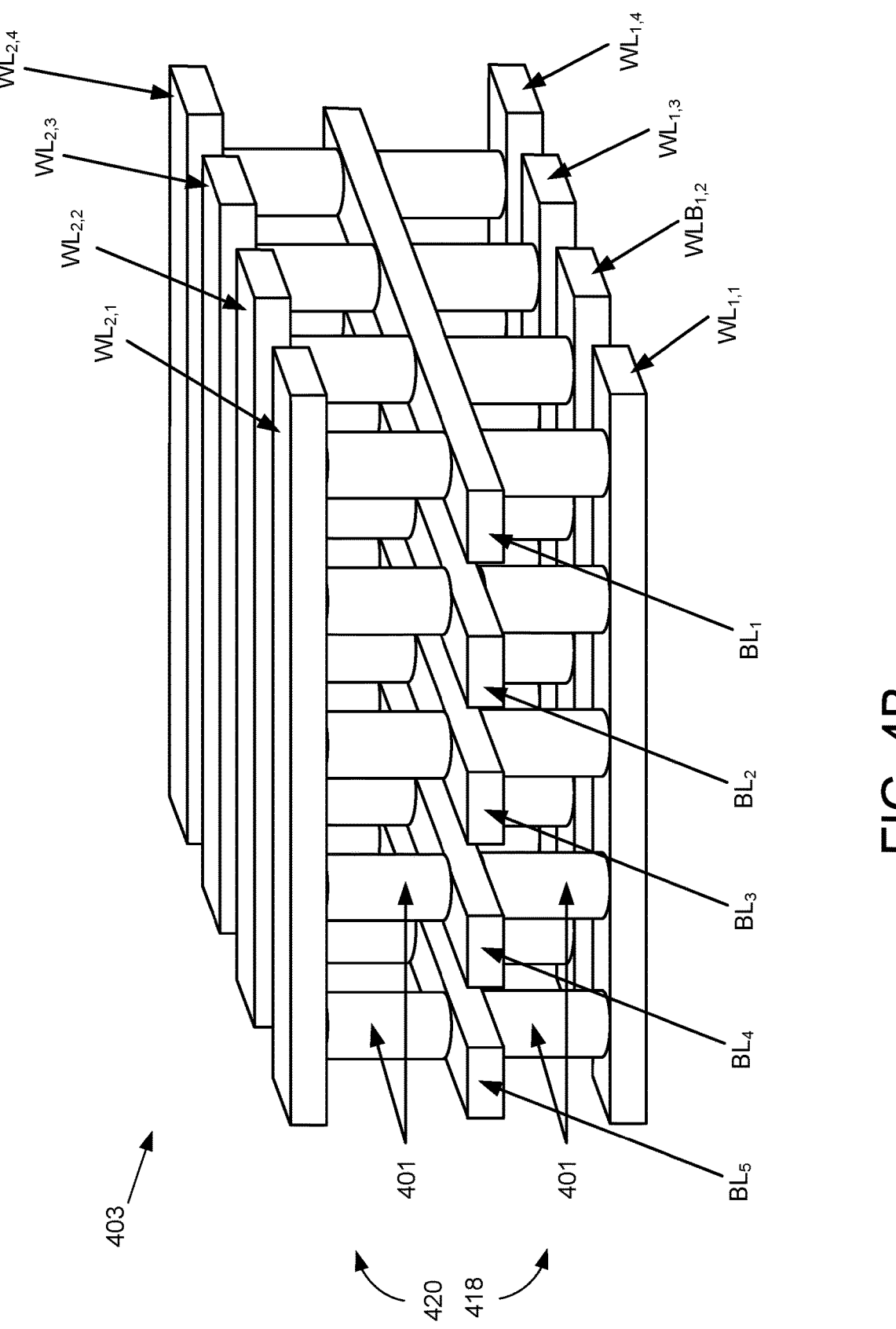
FIG. 4B depicts an embodiment of a portion of a two-level memory array that forms a cross-point architecture in an oblique view.

FIG. 4B depicts an embodiment of a portion of a two-level memory array that forms a cross-point architecture in an oblique view. As in FIG. 4A, FIG. 4B shows a first layer 418 of memory cells 401 of a memory array 403 connected at the cross-points of the first layer of word lines $WL_{1,1}$-$WL_{1,4}$ and bit lines $BL_1$-$BL_5$ above. In an embodiment, each module 310 of FIG. 3B has one or more memory arrays 403 of FIG. 4B. In an embodiment, the structure of FIG. 4B serves as two tiles 320 in a module 310. A second layer 420 of memory cells is formed above the bit lines $BL_1$-$BL_5$ and between these bit lines and a second set of word lines $WL_{2,1}$-$WL_{2,4}$. In effect the BLs are shared. In the alternative a second layer may include another deck of BL above the BL shown and below the $2^{nd}$ deck of WL. Although FIG. 4B shows two layers, 418 and 420, of memory cells, the structure can be extended upward through additional alternating layers of word lines and bit lines in a similar pattern. Depending on the embodiment, the word lines and bit lines of the array of FIG. 4B can be biased for read or program operations such that current in each layer flows from the word line layer to the bit line layer or the other way around. The two layers can be structured to have current flow in the same direction in each layer for a given operation or to have current flow in the opposite directions by driver selection in the positive or negative direction. The memory cell may be placed in the same orientation within the first and second layers enabling use of current in oppositive directions by layer to read or write. Or the memory cell placed in a reversed or flipped direction when placed between the BL and WL in the second layer (enabling use of current in the same direction as is used to read or write in memory cells within the first layer.

The use of a cross-point architecture allows for arrays with a small footprint and several such arrays can be formed on a single die. The memory cells formed at each cross-point can be a resistive type of memory cell, where data values are encoded as different resistance levels, either two levels such as with MRAM or into two or more levels for other memory element technologies such as PCM. Depending on the embodiment, the memory cells can be binary valued, having either a low resistance state or a high resistance state, or multi-level cells (MLCs) that can have additional resistance intermediate to the low resistance state and high resistance state. The cross-point arrays described here can be used in the memory die 102 of FIG. 1 or 2, or in any other configuration where additional memory is useful. Resistive type memory cells can be formed according to many of the technologies mentioned above, such as ReRAM, PCM, FeRAM, or MRAM.

Figure 5:
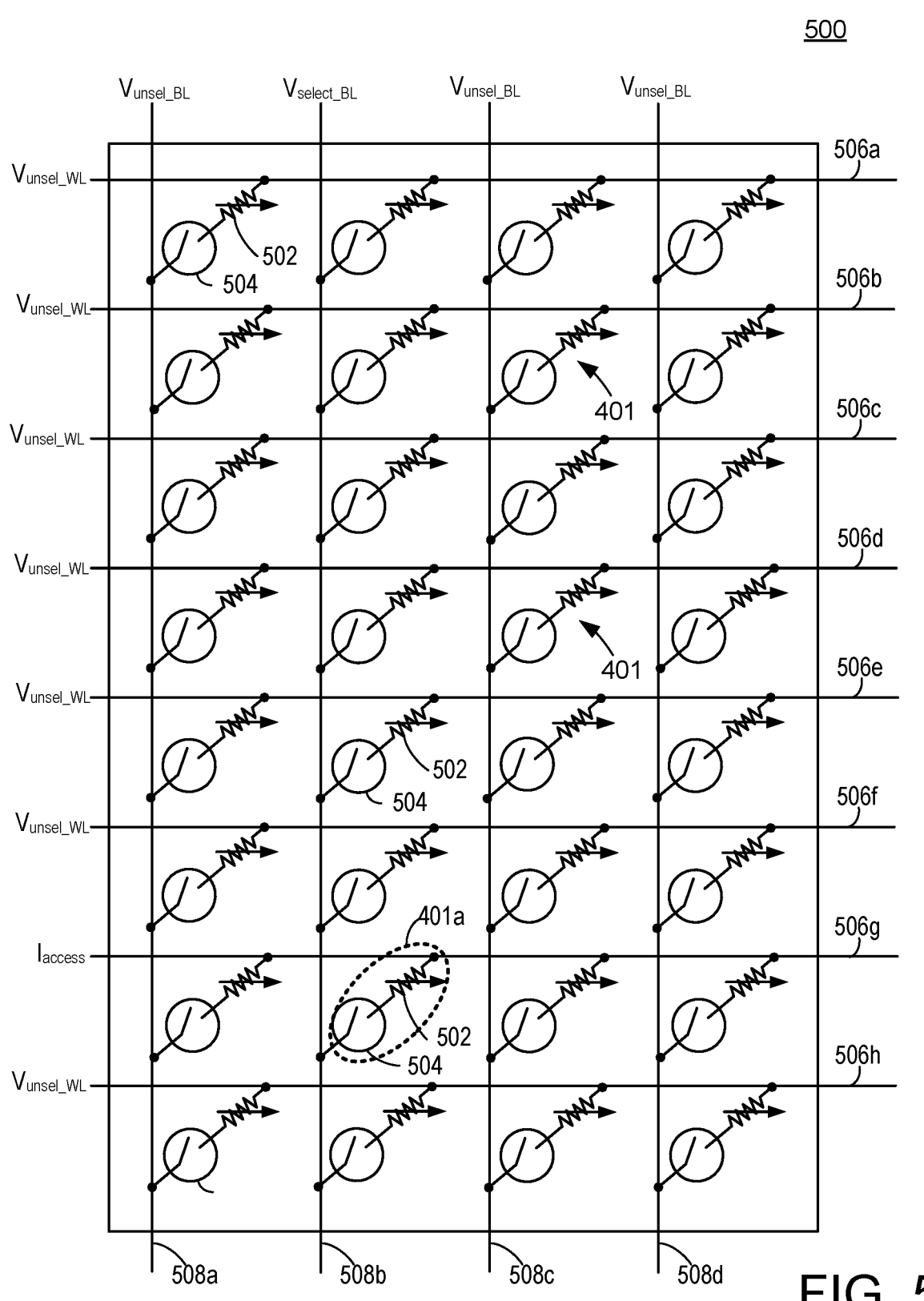
FIG. 5 depicts an embodiment of a memory array having a cross-point architecture.

FIG. 5 depicts an embodiment of a memory array 500 having a cross-point architecture. The memory array 500 may be included in memory core 103 of FIG. 1, the memory structure 202 of FIG. 2, a tile 320 of FIG. 3C or 3D (as well as in a module 310 or bank 302), etc. The array 500 has a set of first conductive lines 506a-506h and a set of second conductive lines 508a-508d. In one embodiment, the set of first conductive lines 506a-506h are word lines and the set of second conductive lines 508a-508b are bit lines. For ease of discussion, the set of first conductive lines 506a-506h may be referred to as word lines and the set of second conductive lines 508a-508b may be referred to as bit lines. However, the set of first conductive lines 506a-506h could be bit lines and the set of second conductive lines 508a-508b could be word lines.

The memory array 500 has a number of programmable resistance memory cells 401. Each memory cell 401 is connected between one of the first conductive lines 506 and one of the second conductive lines 508. In one embodiment, each memory cell 401 has a magnetoresistive random access memory (MRAM) element in series with a threshold switching selector. The threshold switching selector 504 is configured to become conductive with lower resistance in response to application of a voltage level exceeding a threshold voltage of the threshold switching selector 504, and remains conductive with lower resistance until the current through the switching selector 504 is reduced below the selector holding current, Ihold. The threshold switching selector 504 may be a two terminal device. In an embodiment, the threshold switching selector 504 comprises an OTS. Note that in some embodiments, there will not be a threshold switching selector 504 in the memory cell 401.

In FIG. 5, an example is provided of a forced-current approach to read or write the memory cells. However, forced-voltage approaches may also be used. For purpose of discussion, memory cell 401a is being selected for access. This could be a read or a write access. Selected memory cell 401a is at the cross-point of selected word line 506g and selected bit line 508b. A selected memory cell means a memory cell that is selected for a memory operation such as read or write. A selected memory cell is connected between a selected word line and a selected bit line. To select a memory cell 401, a select voltage ($V_{select\_BL}$) such as near ground is provided to the selected bit line (e.g., bit line 508b) and an access current ($I_{access}$) is driven (or forced) through a selected word line (e.g., word line 506g). A selected word line means that the word line is connected to at least one selected memory cell. The selected word line will typically be connected to one or more unselected memory cells. A selected bit line means that the bit line is connected to at least one selected memory cell. The selected bit line will typically be connected to one or more unselected memory cells.

In one embodiment, $V_{select\_BL}$ has an adequate magnitude such that the threshold switching selector 504 in a selected memory cell will turn on, assuming that $I_{access}$ is applied to the selected word line with adequate compliance voltage relative to the BL voltage. For example, $V_{select\_BL}$ may be approximately 0V. On the other hand, $V_{unsel\_BL}$ has a magnitude such that the threshold switching selector 504 in an unselected memory cell will not turn on, for example $V_{select\_BL}$ may be approximately 1.65V if the positive power supply is 3.3V. Access current ($I_{access}$) is driven through at least a portion of selected word line 506g. This access current may also flow through the selected memory cell 401a and in a portion of selected bit line 508b after the OTS is turned on. Such a selected WL may, for example, be driven high by 15 μa to read or 30 μa to write by a current source with compliance voltage of, for example, 3.3V. To write the opposite polarity, the selected word line is forced, for example, with −30 μa and the selected bit line to near 3.3V.

The other memory cells are not selected for access (i.e., are unselected memory cells). An unselected memory cell means that the memory cell is not presently selected for access (e.g., read or write). An unselected word line is connected only to unselected memory cells. An unselected bit line is connected only to unselected memory cells. Word lines and bit lines that are not selected are referred to as unselected word lines or unselected bit lines, respectively. In one embodiment, a word line or bit line may be unselected by forcing them to an unselect voltage, such as Vmid, for example 1.65V, at approximately one half the drive compliance voltage, for example 3.3V. An unselect voltage ($V_{unsel\_BL}$) is provided to the unselected bit lines (e.g., bit lines 508a, 508c, 508d). An unselect voltage ($V_{unsel\_WL}$) such as Vmid is provided to the unselected word lines (e.g., word lines 510a, 510b, 510c, 510d, 510e, 510f, and 510h).

$I_{access}$ could flow in either direction through the selected word line (as well as the selected bit line). In one embodiment, no current other than leakage is forced through unselected word lines (e.g., 506a, 506b, 506c, 506d, 506e, 506f, and 506h).

In the example of FIG. 5 there are more word lines than bit lines in the cross-point array. In one embodiment, there are more bit lines than word lines in the cross-point array. In one embodiment, the number of bit lines equals the number of word lines in the cross-point array. In the example of FIG. 5 there are twice as many word lines as bit lines in the cross-point array; however, a different ratio could be used. Thereby, different tile sizes may be realized. For example, a tile may have 1024 BL by 2048 WL, which may be composed into a module of 2048×4096 cells by center driving the WL and BL between four tiles. In one embodiment, read is performed on a group of memory cells by, for example, selecting one memory cell in each of a number of tiles.

In some embodiment, the memory cells' are addressed based on their physical location within the array 500. The memory cell addresses may be defined by the word lines and the bit lines. The word lines and bit lines may be numbered based on their physical location in the array. Thus, a memory cell's address within the array 500 may be defined by the number of the word line and number of the bit line to which it is connected. In an embodiment, the modules 310 that are read together each have a similar cross-point array that has the same number of word lines and bit lines. Therefore, each of these cross-point arrays may have the same addressing scheme, wherein a common set of addresses may be used within each array (based on the word line number and bit line number). In one embodiment, the memory cells in the different modules 310 that are read together each have the same address within their respective cross-point array.

In some embodiments, a current-force approach is used to access memory cells in a cross-point memory array. Threshold switching selectors may be used in series with the memory cells. The threshold switching selector may be connected in series with the memory element between the word line and the bit line. Hence, any voltage across the switching selector will reduce the voltage across the memory element. Typically, there will be some variation in the offset or hold voltage between the switching selectors. A current-force approach may help to mitigate offset voltage variation between threshold switching selectors to help minimize the selected cell current variation cell to cell. However, as noted above, a voltage-force approach may also be used in which a voltage is applied across the selected memory cell. Also, other configurations of cross-point arrays may be used including, but not limited to, 1T1R.

Figure 6:
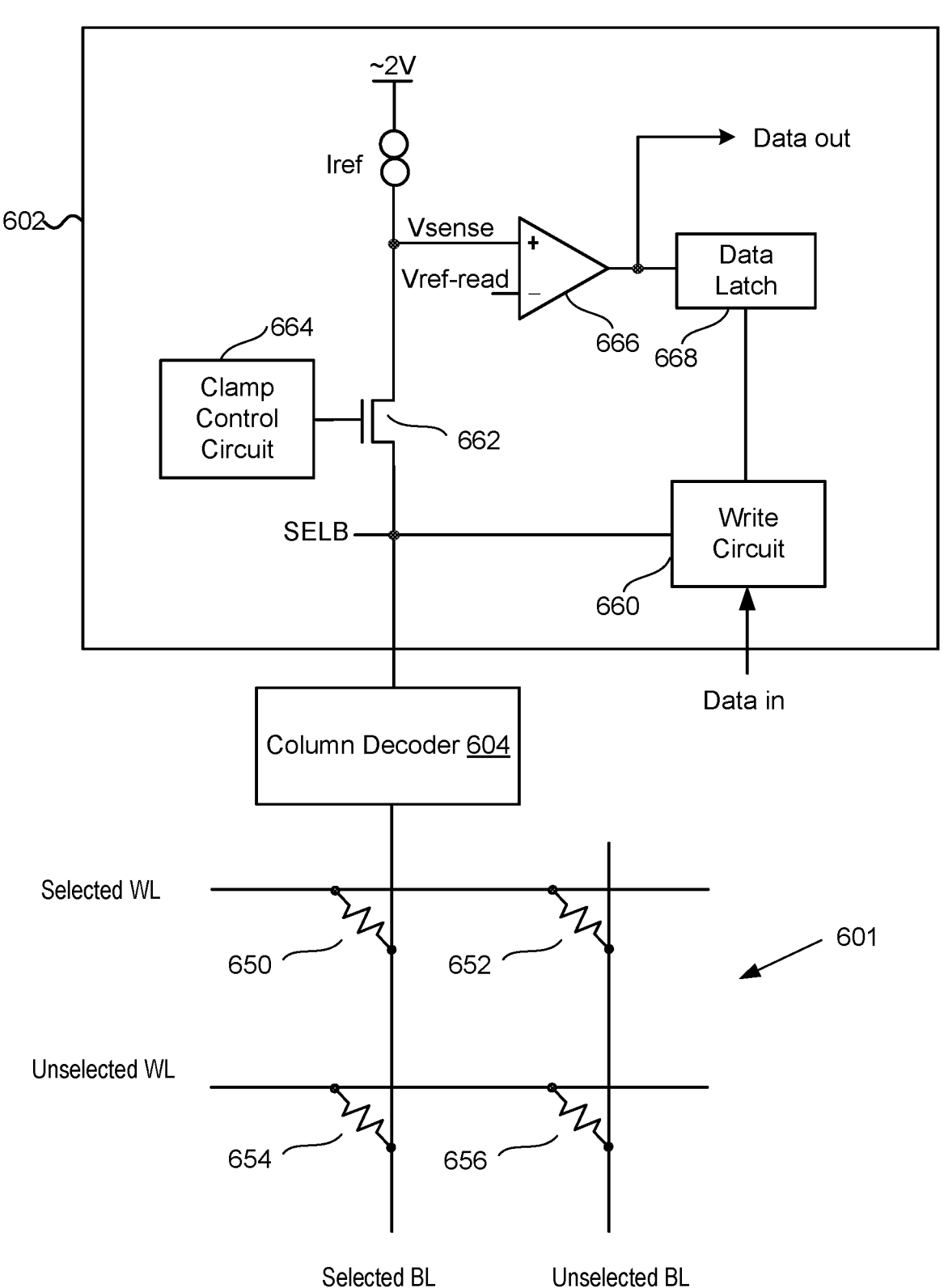
FIG. 6 depicts one embodiment of a read/write circuit along with a portion of a memory array.

FIG. 6 depicts one embodiment of a read/write circuit 602 along with a portion of a memory array 601. FIG. 6 shows an example of a voltage-force approach to sensing a memory cell. Read/write circuit 602 may be used in the memory core control circuits 104 of FIG. 1A, 1B. The portion of a memory array 601 includes two of the many bit lines (one selected bit line labeled "Selected BL" and one unselected bit line labeled "Unselected BL") and two of the many word lines (one selected word line labeled "Selected WL" and one unselected word line labeled "Unselected WL"). The portion of a memory array also includes a selected memory cell 650 and unselected memory cells 652-656. In one embodiment, the portion of a memory array 601 may comprise a memory array with bit lines arranged in a direction horizontal to the substrate, such as memory array 201 in FIG. 3A. In another embodiment, the portion of a memory array 601 may comprise a memory array with bit lines arranged in a vertical direction that is perpendicular to the substrate, such as memory array 402 in FIG. 4A. The selected bit line is biased to a bit line select voltage (e.g., 1V to 2V), the unselected word line is biased to a bit line unselect voltage (e.g., 0.6V to 2V), the selected word line is biased to a word line select voltage (e.g., 0V), and the unselected bit line is biased to a bit line unselected voltage (e.g., 0V to 0.5V). In other embodiments, the memory array biasing scheme of FIG. 6 may be reversed such that the selected bit line is biased to a lower voltage than the selected bit line.

As depicted in FIG. 6, the SELB node of read/write circuit 602 is electrically coupled to the selected bit line via column decoder 604. In one embodiment, column decoder 604 may correspond with column decoder 212 depicted in FIG. 2. Transistor 662 couples node SELB to the Vsense node. Clamp control circuit 664 controls the gate of transistor 662. The Vsense node is connected to reference current Iref and one input of sense amplifier 666. The other input of sense amplifier 666 receives Vref-read, which is the voltage level used for comparing the Vsense node voltage in read mode. The output of sense amplifier 666 is connected to the data out terminal and to data latch 668. Write circuit 660 is connected to node SELB, the data in terminal, and data latch 668.

During a read operation, read/write circuit 602 biases the selected bit line to the selected bit line voltage in read mode. Prior to sensing data, read/write circuit 602 will precharge the Vsense node to, for example, 2V. When sensing data, read/write circuit 602 attempts to regulate the SELB node to, for example, 1V via clamp control circuit 664 and transistor 662 in a source-follower configuration. If the current through the selected memory cell 650 is greater than the read current limit, Iref, then, over time, the Vsense node will fall below Vref-read (e.g., set to 1.5V) and the sense amplifier 666 will read out a data "0." Outputting a data "0" represents that the selected memory cell 650 is in a low resistance state. The "data out" is referred to herein as a "read result." If the current through the selected memory cell 650 is less than Iref, then the Vsense node will stay above Vref-read and the sense amplifier 666 will read out a data "1." Outputting a data "1" represents that the selected memory cell 650 is in a high resistance state. Data latch 668 will latch the output of sense amplifier 666 after a time period of sensing the current through the selected memory cell (e.g., 400 ns).

Figure 7:
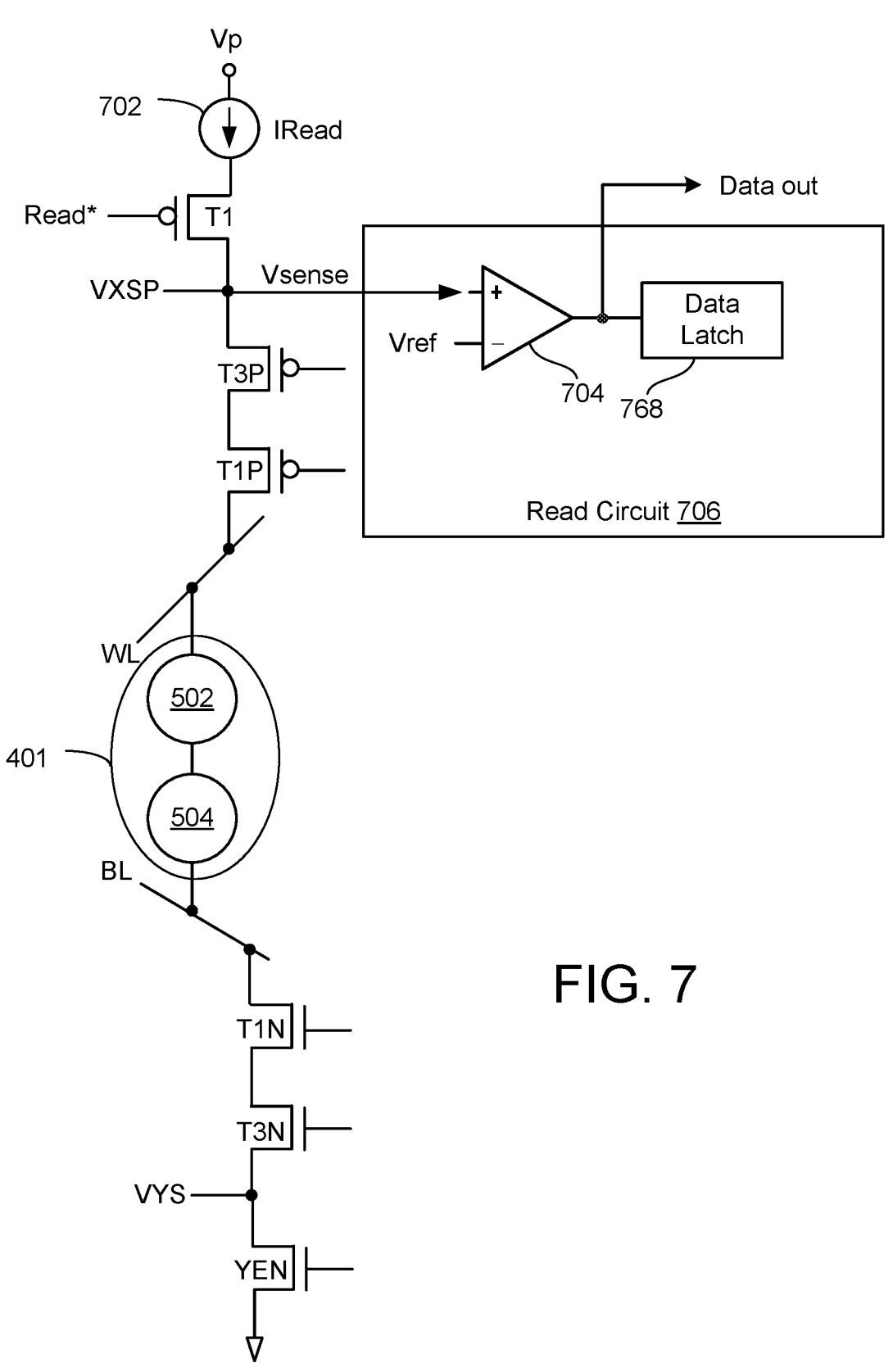
FIG. 7 is a schematic diagram of one embodiment of a read path, as well as a sense amplifier.

FIG. 7 is a schematic diagram of one embodiment of a read path, as well as a read circuit 706. FIG. 7 shows an example of a current-force approach to sensing a memory cell. The read path includes a current source 702, word line decode transistors, the selected word line, the memory cell 401, the selected bit line, and bit line decode transistors. The read path has a Vp positive power supply, such as 4V. The read current source 702 is connected to the power supply (Vp) and supplies Iread to the memory cell. The read current may be enabled by taking Read* to low to turn on transistor T1. The output of T1, which is node VXSP, also drives the non-inverting input (+) of the differential sense amp 704. The output of sense amplifier 704 is connected to the data out terminal and to data latch 768. P-channel transistor T3P serves as a global WL decoder, which may be selected when the gate of T3P is low, such as when driven by a binary decoder address signal from the host. P-channel transistor T1P serves as a local WL decoder, which may be selected when the gate of T1P is low, such as when driven by a binary decoder address signal from the host. P-channel transistor T3P may serve as a driver to the selected WL. The memory cell 401 is connected between the selected WL and the selected BL. The memory cell (or bit) has a threshold switching selector 504 and a memory element 502. The selected WL may be 1 of N WLs in an array. The selected BL may be 1 of M BLs in an array. The memory cell 401 may reside at a cross-point of the selected WL and the selected BL on a chip with one or more arrays. N-channel transistor T1N may serve as a local decode driver into the selected BL. The BL may be selected when T1N gate is high, such as when driven by a binary decoder address signal from the host. N-channel transistor T3N may serve as a global decoder, which is selected when T3N gate is high, such as when driven by a binary decoder address signal from the host. The output of T3N is VYS. A driver (YEN) is between VYS and a negative power supply (GND). To write reverse, there may be a separate driver connected to VYS and a positive power supply Vp to which VYS is driven, and a parallel p-ch transistor decode path (n-ch T1 and T3) may be provided in parallel with the here described n-ch driver path. The n-ch path is then turned off and the p-ch path enabled along with a driver transistor to Vp with gate at ground. Similarly a n-ch path may be provided provide along with a current source to ground provided in parallel with the above described p-ch path to the word line with its current source to Vp or some other more suitable voltage. The p-ch path is then turned off and the n-ch path enabled by turning on an n-ch driver transistor in series with a current source to ground. The sense amp 704 has a non-inverting input (+) and an inverting input (−). The inverting input (−) is provided with a reference voltage (Vref). The non-inverting input (+) is connected to VXSP.

Operation of the read path may in one embodiment be as follows. Node VXSP, the selected WL, the selected BL and VYS may be transistor pre-charged to Vmid during a standby phase. The desired WL line (1 of N) may be selected by turning off the precharge and applying a low voltage to the gates of transistors T3P and T1P (the gate voltages being referred to as decode address signals). The BL line may be selected by turning off the precharge and applying a high voltage to the gates of transistors TIN and T3N (the gate voltages being referred to as decode address signals). The gate of transistor YEN may be taken high to connect node VYS to GND. Iread may then be turned on and connected to VXSP by taking the gate of T1 low (e.g., Read* goes low). The BL may thus be rapidly pulled to GND by its active driver upon turn-on by YEN going H. The selected WL and VXSP are ramped towards Vp by Iread. The threshold switching selector 504 turns on when the voltage on WL reaches an approximate voltage of Vth(OTS) since IxR drops from leakage are relatively low. Here, Vth(OTS) refers to the threshold switching voltage of the threshold switching selector 504, which may be but it not required to be an OTS. Then, the voltage on VXSP into the sense amp 704 settles back at Vsense=Vread(final)=Voff(OTS)+Rpath×Iread. Here, Rpath includes WL and BL wire resistances, the address transistors (T3P, T1P, T1N, T3N) and the driver (YEN) to GND, as well as the resistance of the memory element itself 702. Here, Voff(OTS) refers to a voltage across the threshold switching selector 504. The sense amp 704 compares Vsense that is input on sense amp (+) to Vref on sense amp (−). The "data out" is referred to herein as a "read result."

Figure 8:
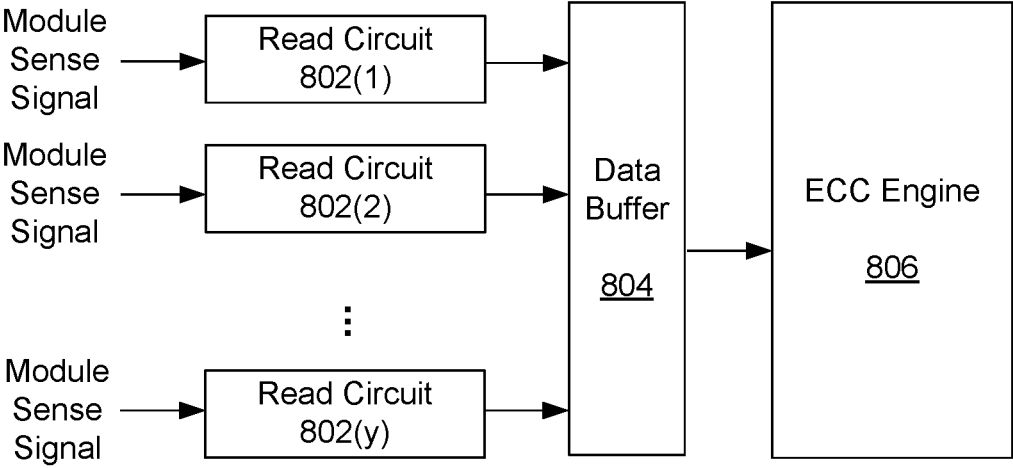
FIG. 8 depicts components used to sense and decode an ECC codeword.

After the memory cells are read, the read results may be provided to an ECC engine. FIG. 8 depicts components used to sense and decode an ECC codeword. The components include a number of read circuits (SA) 802(1)-802($v$), a data buffer 804, and an ECC engine 806. The read circuits 802 may be, but are not limited to, a collection of read/write circuits 602 (see FIG. 6) or read circuits 706 (see FIG. 7). Alternatively, read circuits 802 may be, but are not limited to, a collection of sense amps 666 (see FIG. 6) or differential sense amps 704 (see FIG. 7). Each module 310 provides a sense signal to a read circuit 802. The sensing signal results from sensing a selected memory cell in that module 310. The sensing signal may be a current or a voltage. The read circuit 802 determines a data output by, for example, comparing the sensing signal with a reference signal. The data outputs are provided by the read circuits 802 to the data buffer 804, which stores the data outputs. The data outputs corresponds to one or more ECC codewords. The data outputs are provided to the ECC engine 806 which decodes the one or more ECC codewords. The ECC engine 806 may output a signal indicating whether decoding succeeded or failed. If decoding succeeded, then the ECC engine 806 outputs the data bits of the one or more codewords.

Figures 9A, 9B:
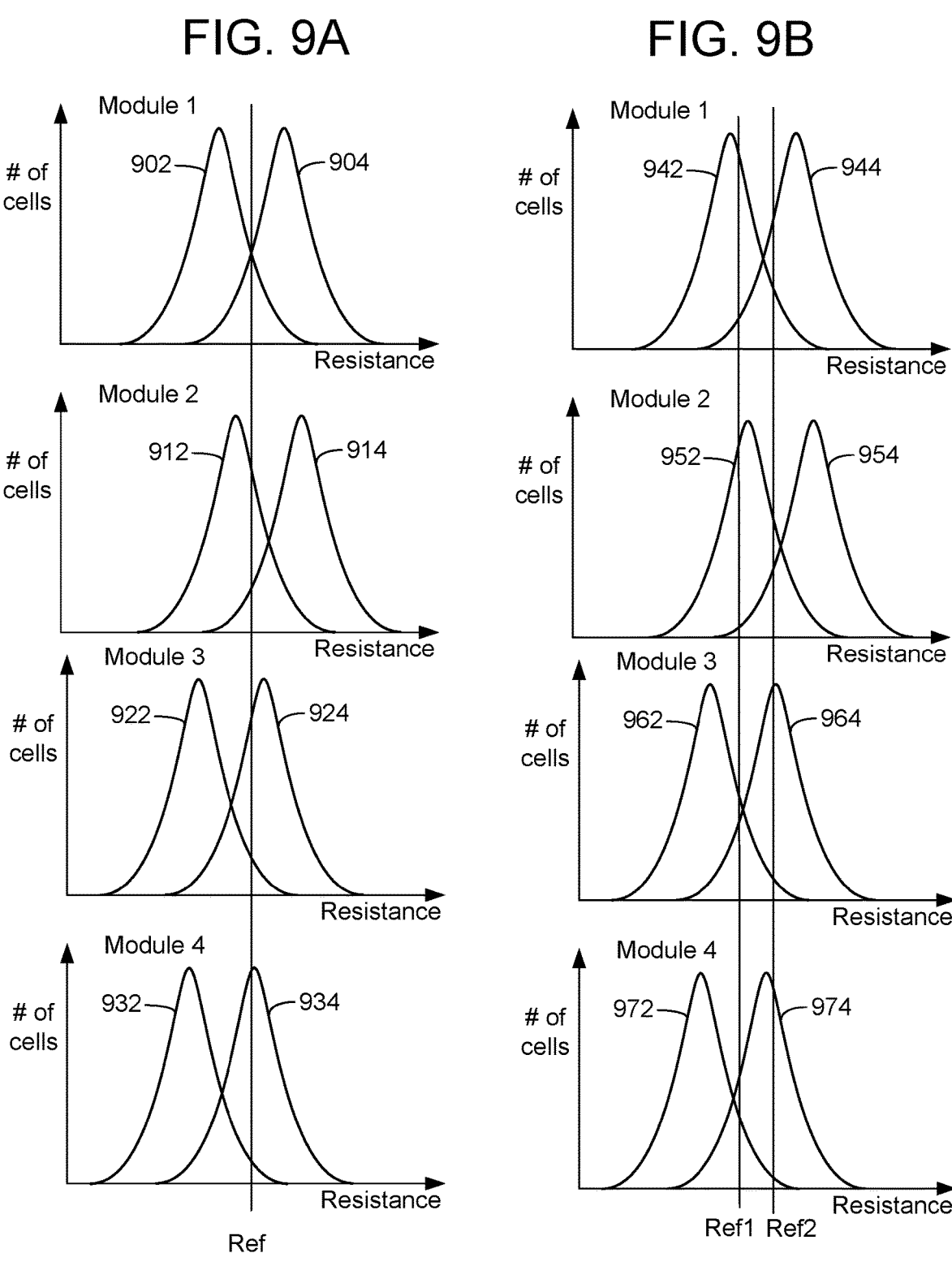
FIGS. 9A and 9B depict resistance distributions of programmable resistance memory cells.

In an embodiment, the memory system uses two or more references to read a group of memory cells. FIGS. 9A and 9B depict resistance distributions of programmable resistance memory cells. FIG. 9A illustrates how use of a single reference when reading the memory cells has limitations if there are significant differences between the modules. FIG. 9B illustrates how use of two references can significantly increase the read accuracy, thereby reducing the bit error rate (BER).

FIG. 9A shows resistance distributions for four different modules 310. A low resistance state (LRS) and a high resistance state (HRS) is depicted for each module 310. In some embodiments, the high resistance is an AP-state, for example 50K Ohm, and the low resistance is a P-state, for example 25K Ohm. The single reference (Ref) works well for resistance distributions 902, 904 for Module 1, given that the Ref is located at the "valley" between the resistance distributions 902, 904. However, the single reference is too low for Module 2, given that the Ref is located well below "valley" between the resistance distributions 912, 914. The single reference is too high for Module 3, given that the Ref is located well above "valley" between the resistance distributions 922, 924. Also, the single reference is too high for Module 4, given that the Ref is located well above "valley" between the resistance distributions 932, 934.

FIG. 9B shows the same resistance distributions for the four different modules 310. However, there are two reference levels (Ref1, Ref2). The lower reference (Ref1) works well for resistance distributions 962, 964 for Module 3, given that the Ref is located close to the "valley" between the resistance distributions 962, 964. The lower reference (Ref1) also works well for resistance distributions 972, 974 for Module 4, given that the Ref1 is located close to the "valley" between the resistance distributions 972, 974. The upper reference (Ref2) works well for resistance distributions 942, 944 for Module 1, given that the Ref is located close to the "valley" between the resistance distributions 962, 964. The upper reference (Ref2) also works well for resistance distributions 952, 954 for Module 2, given that the Ref2 is located close to the "valley" between the resistance distributions 952, 954.

In some embodiments, the memory system will use two different reference signals to read a group of memory cells. For example, rather than using just "Ref" in FIG. 9A, the memory system determines a suitable "Ref1" and "Ref2", as in FIG. 9B. The group of cells in the different modules may be read twice, with each read using one of the reference signals. Final read results may be generated by selecting the read results based on Ref1 for one set of the cells and selecting the read results based on Ref2 for another set of the cells. Therefore, the read may compensate for differences between the modules to improve read accuracy.

Figure 10A:
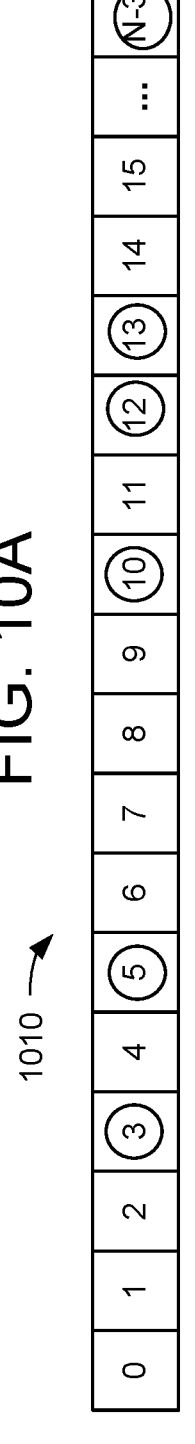
FIG. 10A depicts which modules will use a first reference signal and which will use a second reference signal for the final read results.

FIG. 10A depicts a table 1010 of which modules will use a first reference signal and which will use a second reference signal for the final read results. A total of n modules are listed from 0 to n-1. Modules 3, 5, 10, 12, 13, and n-3 are circled to indicate that the second reference signal works better for these modules (note that modules 16 to n-3 are not shown). The first reference signal will work better for the other modules. In one embodiment, the table 1010 is stored in the trim settings 315 on a bank 302 that contains the modules 310.

Figure 10B:
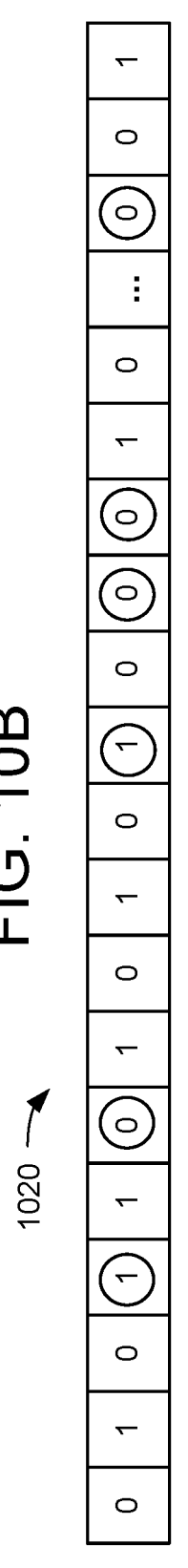
FIG. 10B shows results of a first read using the first reference signal for each module.

FIG. 10B shows first read results 1020 of a first read using the first reference signal for each module. For ease of reference the modules for which the second reference signal will work best are circled.

Figure 10C:
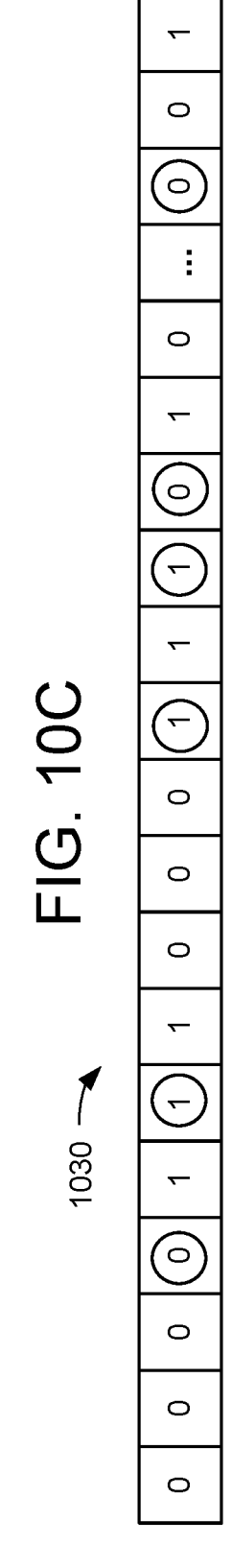
FIG. 10C shows results of a second read using the second reference signal for each module.

FIG. 10C shows second read results 1030 of a second read using the second reference signal for each module. Again, for ease of reference the modules for which the second reference signal will work best are circled. A comparison of the results in FIG. 10C and 10B shows that the results may differ given the use of the different reference signals.

Figure 10D:
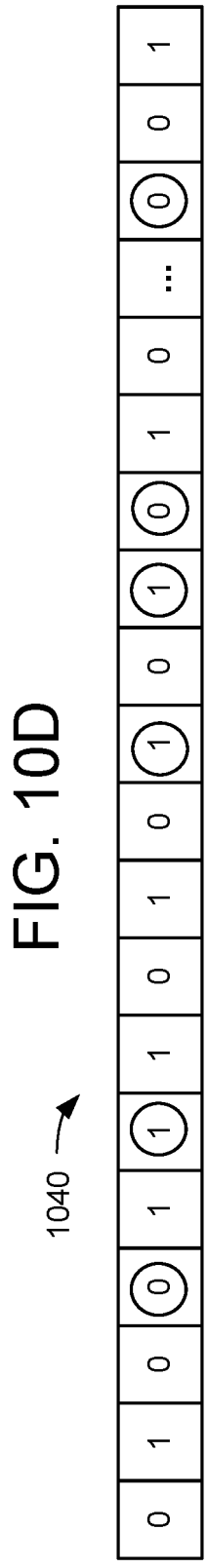
FIG. 10D shows results of combining the first results and the second results to produce final results.

FIG. 10D shows final read results 1040 of combining the first results and the second results. The final read results 1040 use the first read results 1020 of the read using the first reference signal for the modules that work best with the first reference signal and use the second read results 1030 of the read using the second reference signal for the modules that work best with the second reference signal. In one embodiment, each of the circled results in FIG. 10B is replaced with a corresponding circled result in FIG. 10C to produce final results in FIG. 10D.

FIG. 11 is a flowchart of one embodiment of a process 1100 of reading programmable resistance memory cells in cross-point memory arrays. The process 1100 may be used to read one or more ECC codewords. In one embodiment, the process 1100 reads one memory cell in each of a number of modules 310. The memory cells that store the one or more ECC codewords and are read may be at the same relative physical locations in the cross-point arrays. For example, using FIG. 5 as an example, each cross-point array may have a number of word lines and a number of bit lines. Each memory cell's physical location within its cross-point array may be defined by the word line and bit line to which it is directly connected. In an embodiment, the address of the memory cell is based on its physical location within its cross-point array. For example, the address within the cross-point array may be defined based on the word line and the bit line to which the memory cell is directly connected. In an embodiment, the memory cells that store the one or more ECC codewords and are read have the same address within their respective cross-point array. Each As one example, the process 1100 could be used to read a bank 302, but it is not required that all of the modules 310 in a bank 302 be read in this process 1100. In one embodiment a current force technique is used to read the cells. In one embodiment a voltage force technique is used to read the cells.

Step 1102 includes performing a first read of at least a first subset of a group of memory cells using a first reference signal to generate first read results. In one embodiment, the first reference signal is a reference voltage that is compared to a voltage produced by sensing a memory cell. For example, the first reference signal may be Vref-read in FIG. 6 or Vref in FIG. 7. In one embodiment, the first reference signal is a reference current that is compared to a current from a memory cell in a voltage force read. For example, the first reference signal may be Iref in FIG. 6. In one embodiment, the first reference signal is a read reference voltage applied to a memory cell in a voltage force read. For example, the first reference signal may be the difference in voltage between the voltage on the selected WL and the selected BL. In one embodiment, the first reference signal is a read reference current in a current force read. For example, the first reference signal may be Iread in FIG. 7. FIG. 10B represents an example of the first read results. The first read results may be stored in a data buffer (e.g., data buffer 804, FIG. 8).

Figure 18:
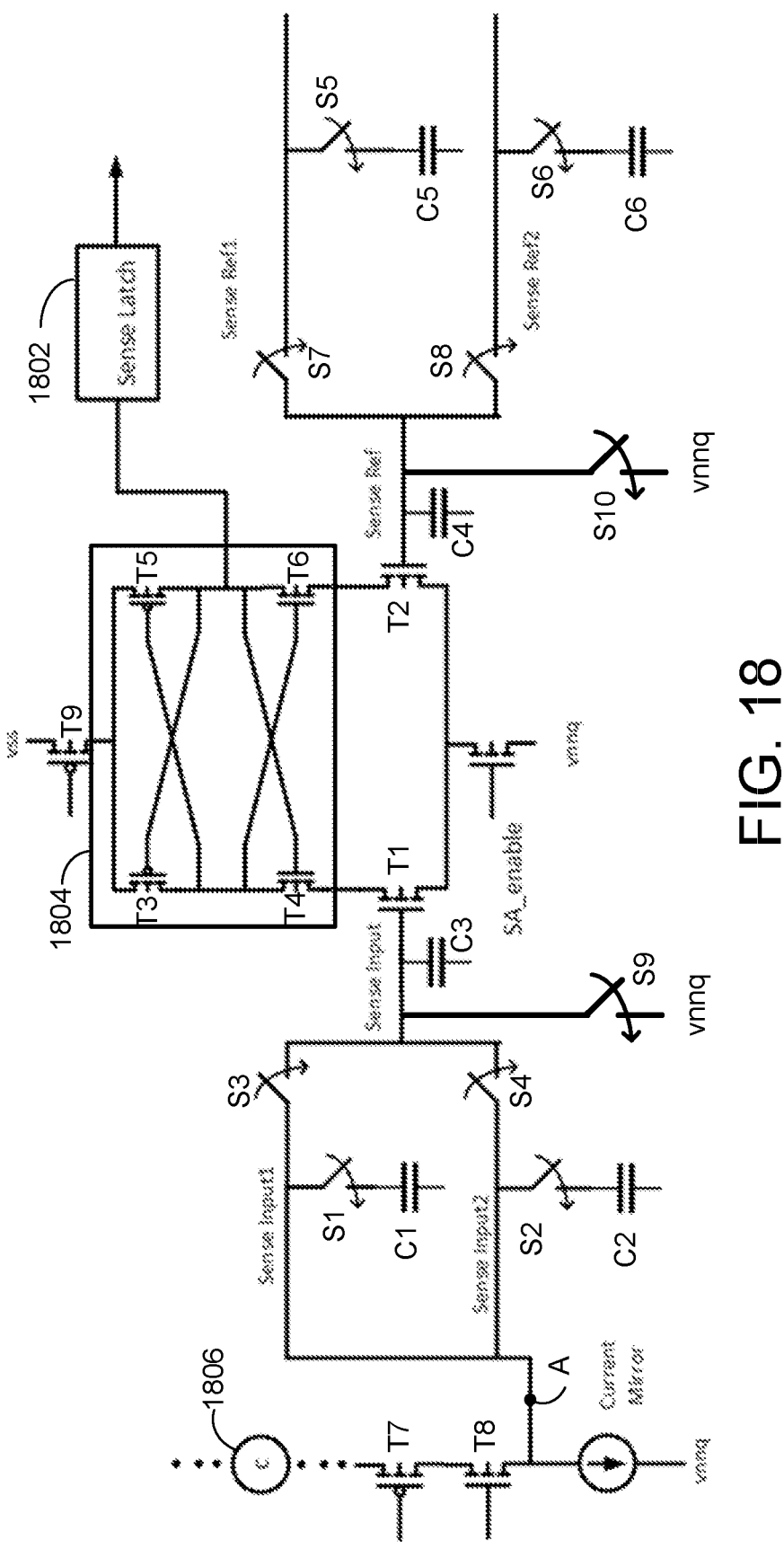
FIG. 18 is a schematic of one embodiment of a sense amplifier that may be used for single sampling in a two-step redundant read scheme.

Step 1104 includes performing a second read of at least a second subset of the group of memory cells using a second reference signal to generate second read results. The second reference signal is the same type of signal as used in step 1102, but has a different magnitude. For example, with reference to FIG. 7, the magnitude of Vref will be different for the second read than for the first read. As another example, with reference to FIG. 6, the magnitude of Vref-read will be different for the second read than for the first read. As still another example, with reference to FIG. 6, the magnitude of Iref will be different for the second read than for the first read. As still another example, with reference to FIG. 7, the magnitude of Iread will be different for the second read than for the first read. As still another example, with reference to FIG. 6, the magnitude of the voltage between the Selected WL and the Selected BL will be different for the second read than for the first read. FIG. 10C represents the second read results. The second read results may be stored in a data buffer (e.g., data buffer 804, FIG. 8). Note that in some embodiments, the second read does not require a second sense operation. For example, the sensing results from the first read may be stored on sense capacitors for use during the second read. FIG. 18, to be discussed below, depicts one embodiment of a sense amplifier that may be used to perform two reads with a single sensing of a memory cell. The two reads may, for example, have two different reference voltages Vref.

Step 1106 includes forming final read results that include the first read results for the first subset of cells and the second read results for the second subset of cells. FIG. 11D represents an example of the final read results. In one embodiment, step 1106 includes replacing selected results of the first read with corresponding results of the second read. In one embodiment, some of the second read results from step 1104 simply overwrite the corresponding first read results in the data buffer 804 to directly produce the final read results.

Step 1108 includes applying an error correction algorithm to the final read results. Step 1108 this decides one or more ECC codewords. The data bits may then be provided to the host 106.

FIG. 12 is a flowchart of one embodiment of a process 1200 of reading programmable resistance memory cells in cross-point arrays. The process 1200 provides further details of one embodiment of process 1100 in FIG. 11. Some steps of process 1200 are similar to those in process 1100 and therefore will not be discussed in detail.

Step 1202 includes performing a first read of a group of memory cells using a first reference signal to generate first read results. Step 1202 may be similar to step 1102 in FIG. 11 and therefore will not be discussed in detail.

Step 1204 includes providing the first read results to an ECC engine (e.g., ECC engine 806, FIG. 8). Step 1206 includes a determination of whether decoding was successful. If so, the decoded data bits are provided to the host 106 in step 1208 and the process 1200 ends.

If decoding was not successful then a second read of the group of memory cells is performed using a second reference signal to generate second read results in step 1210. Step 1210 may be similar to step 1104 in FIG. 11 and therefore will not be discussed in detail. Step 1212 includes replacing selected first results with selected results of the second read. Step 1212 may be similar to step 1106 in FIG. 11 and therefore will not be discussed in detail.

Step 1214 includes providing the updated read results to the ECC engine 806. Step 1216 includes a determination of whether decoding was successful. If so, the decoded data is provided to the host in step 1218 and the process 1200 ends. If decoding failed, then in step 1220 a read failure may be reported to the host 106.

Figure 13:
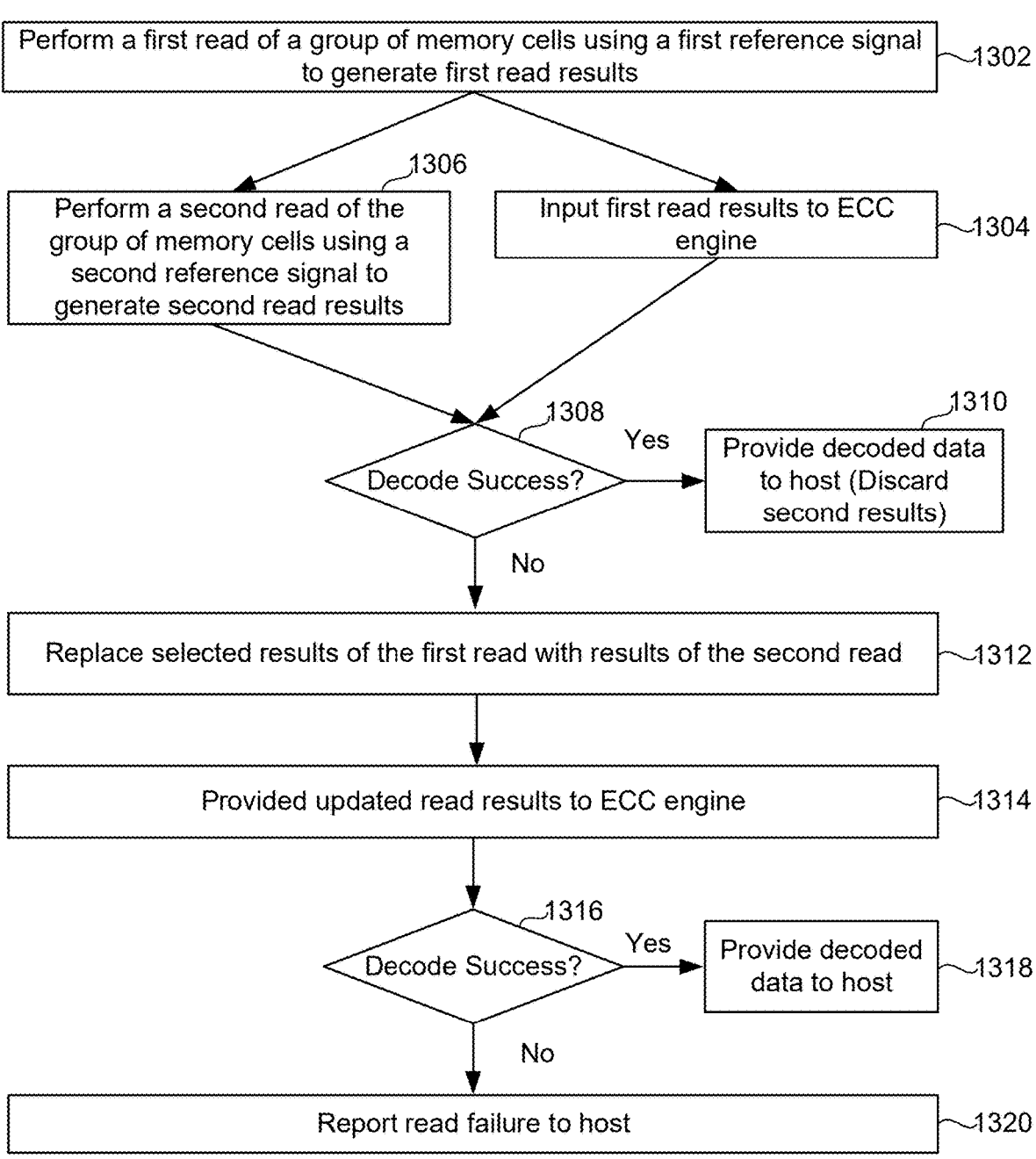
FIG. 13 is a flowchart of one embodiment of a process of reading programmable resistance memory cells in cross-point arrays where a second read is performed in without regard to a decode failure.

FIG. 13 is a flowchart of one embodiment of a process 1300 of reading programmable resistance memory cells in cross-point arrays. The process 1300 provides further details of one embodiment of process 1100 in FIG. 11. Some steps of process 1300 are similar to those in process 1100 and therefore will not be discussed in detail.

Step 1302 includes performing a first read of a group of memory cells using a first reference signal to generate first read results. Step 1302 may be similar to step 1102 in FIG. 11 and therefore will not be discussed in detail.

Step 1304 includes providing the first read results to an ECC engine (e.g., ECC engine 806, FIG. 8). Step 1306 includes performing a second read of a group of memory cells using a second reference signal to generate second read results. Step 1306 may be similar to step 1102 in FIG. 11 and therefore will not be discussed in detail. Note that step 1306 may be started prior to the ECC engine 806 provided a decoding result. The read in step 1306 may begin prior to, at the same time, or after the ECC engine begins to decode the first read results.

Step 1308 includes a determination of whether decoding was successful. If so, the decoded data is provided to the host 106 in step 1310 and the process 1300 ends.

If decoding was not successful then selected first read results are replaced with selected read results of the second read in step 1312. Step 1312 may be similar to step 1106 in FIG. 11 and therefore will not be discussed in detail.

Step 1314 includes providing the updated read results to the ECC engine 806. Step 1316 includes a determination of whether decoding was successful. If so, the decoded data bits are provided to the host in step 1318 and the process 1300 ends. If decoding failed, then in step 1320 a read failure may be reported to the host 106.

There are numerous ways in which the first read and the second read in process 1100, 1200, and/or 1300 may be performed. FIGS. 14-17 describe various embodiments of the first read and the second read that may be used in any of process 1100, 1200, and/or 1300. In some embodiments, the first and second reference signals that are used to compensate for differences between modules are reference voltages. In an embodiment,, these references voltages are input to a differential sense amplifier to determine read results. FIG. 14 is a flowchart of one embodiment of a process 1400 of reading memory cells. The process 1400 provides further details for an embodiment of process 1100 in FIG. 11. Process 1400 may be used to compensate for differences between modules having cross-point arrays. In process 1400 the first and second reference signals that are used to compensate for differences between modules are reference voltages.

Step 1402 include sensing the group of memory cells in a first read to generate sensed voltages. In step 1402 the sensed voltages are generated in response to a signal applied to each respective memory cell. The signal may be a current through the memory cell or a voltage applied across the memory cell. Further details are described below in connection with FIGS. 14A and 14B.

Optional step 1403 includes storing the sensed voltages on two different sets of capacitors. One set of capacitors will be used for the first read and the other set will be used for the second read to follow. Step 1403 is optional in that the sense voltages need not be stored on two different sets of capacitors. Instead the memory cells may be sensed again in step 1406.

Step 1404 includes comparing the sensed voltages of the first reads with a first reference voltage to generate first read results. In one embodiment, the voltages stored on the first set of sense capacitors are used in step 1404. In one embodiment, for each memory cell the sensed voltage from step 1402 is compared by a differential amplifier with the first reference voltage.

Optional step 1406 include sensing the group of memory cells in a second read to generate sensed voltages. In optional step 1406 the sensed voltages are generated in response to a signal applied to each respective memory cell. This signal may have the same magnitude as the signal from step 1402. Step 1406 is optional in the event that the sense voltages from the first read were stored on the two set of capacitors.

Step 1408 includes comparing the sensed voltages with a second reference voltage having a different magnitude than the first magnitude to generate second read results. If the sensed voltages from the first read were stored on the second set of capacitors, then the voltages from the second set of capacitors may be used in step 1408. However another option is to sense the memory cells again in step 1406. Similar to step 1404, for each memory cell, the sensed voltage from step 1406 may be compared by a differential amplifier with the second reference voltage.

Figure 14A:
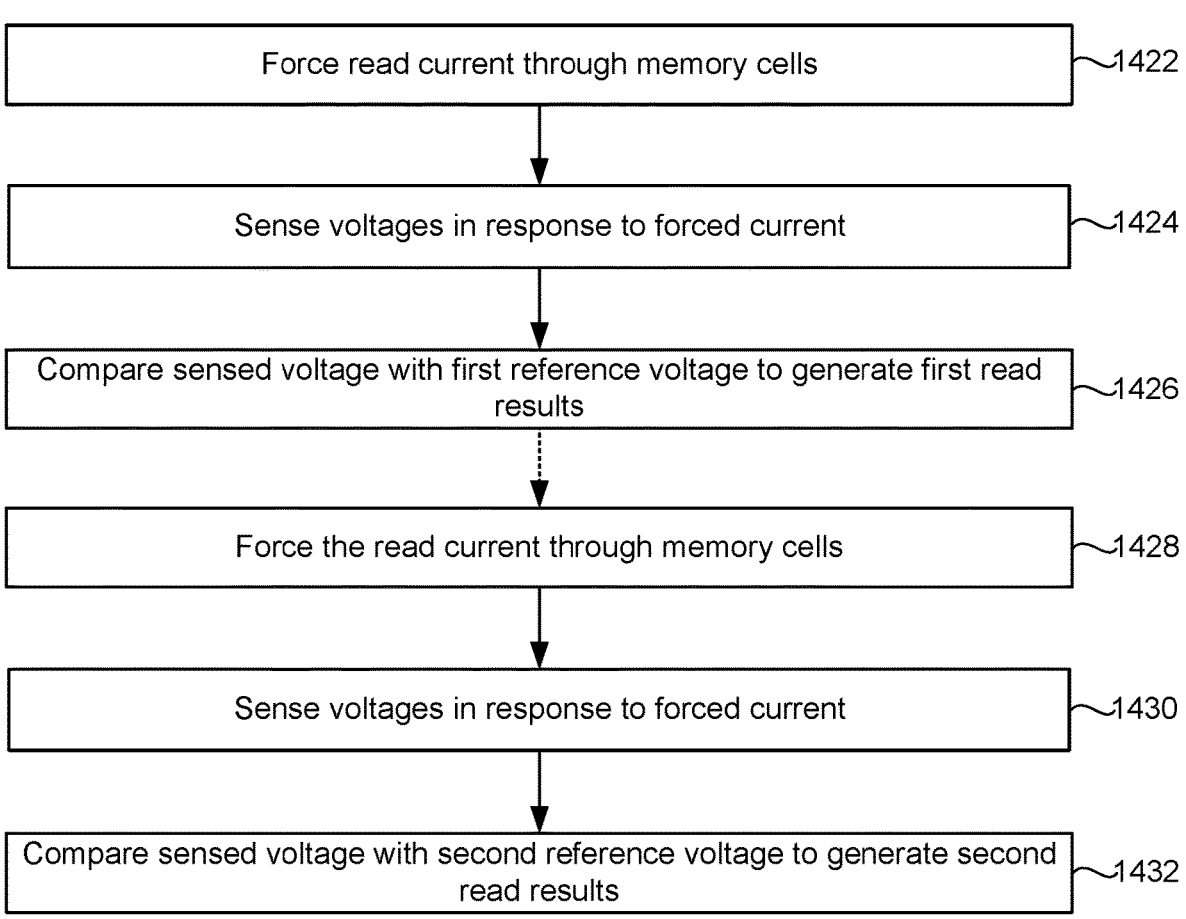
FIG. 14A is a flowchart of one embodiment of a process of current-forced reading memory cells that includes two read with different reference voltages.

FIG. 14A is a flowchart of one embodiment of a process 1420 of reading memory cells. The process 1420 provides further details for an embodiment of process 1400 in FIG. 14. Process 1420 may be used to compensate for differences between modules having cross-point arrays. Process 1420 describes one embodiment of a forced-current read. Process 1420 will be described with reference to FIG. 7, but is not limited thereto.

Step 1422 include forcing a read current through the respective memory cells in the different modules. With respect to FIG. 7, Iread may be forced through a memory cell in each of the different modules. Step 1424 includes sensing voltages in response to forcing the read current through the respective memory cells. With respect to FIG. 7, the voltage at VXSP is sensed and provided to the differential sense amp 704. Step 1426 includes comparing the sensed voltages of the first reads with a first reference voltage. With respect to FIG. 7, the voltage at VXSP (Vsense) is compared by the differential sense amp 704 with Vref. Here, Vref is the first reference voltage.

Step 1428 include forcing the read current through the respective memory cells. With respect to FIG. 7, Iread may be forced through each respective memory cell. Note that Iread may have the same magnitude as in step 1422. Step 1430 includes sensing voltages in response to forcing the read current through the respective memory cells. With respect to FIG. 7, the voltage at VXSP is sensed and provide to the differential sense amp 704. Step 1432 includes comparing the sensed voltages of the second reads with a second reference voltage. With respect to FIG. 7, the voltage at VXSP (Vsense) is compared by the differential sense amp 704 with Vref. However, Vref has a different magnitude in step 1432 than in step 1426. The different magnitude of Vref may be used to compensate for differences between the modules.

Figure 14B:
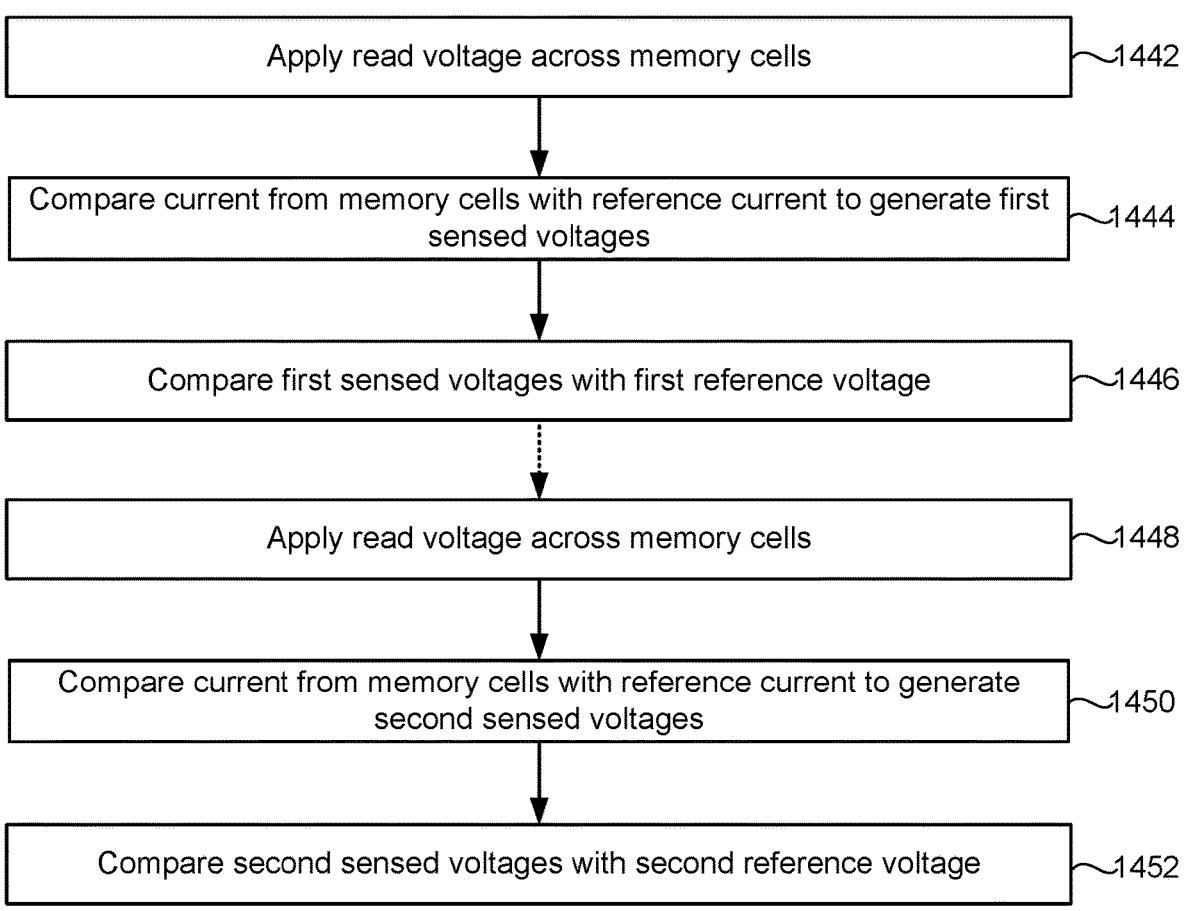
FIG. 14B is a flowchart of one embodiment of a process of voltage-forced reading memory cells that includes two read with different reference voltages.

FIG. 14B is a flowchart of one embodiment of a process 1440 of reading memory cells. The process 1440 provides further details for an embodiment of process 1400 in FIG. 14. Process 1440 may be used to compensate for differences between modules having cross-point arrays. Process 1440 describes one embodiment of a forced-voltage read. Process 1440 will be described with reference to FIG. 6, but is not limited thereto.

Step 1442 include applying a read voltage across the respective memory cells. With respect to FIG. 6, the read voltage may be applied across the selected memory cell in each respective module. The read voltage is applied between the selected WL and the selected BL. Step 1444 includes comparing a current from the respective memory cells in response to the read voltage to a reference current to generate a sensed voltage. With respect to FIG. 6, the current from the selected memory cell is compared with Iref to generate Vsense, which is provided to the differential sense amp 666. Step 1446 includes comparing the sensed voltages (Vsense) of the first reads with a first reference voltage. With respect to FIG. 6, for each cell, Vsense is compared by the differential sense amp 666 with Vref-read. Here, Vref-read is the first reference voltage.

Step 1448 includes applying the read voltage across the respective memory cells. This may be similar to step 1442. Step 1450 includes comparing a current from the respective memory cells in response to the read voltage to a reference current to generate a sensed voltage. Step 1450 may be similar to step 1444, with Iref having the same magnitude as in step 1444. Step 1452 includes comparing the sensed voltages (Vsense) of the second reads with a second reference voltage. With respect to FIG. 6, for each cell, Vsense is compared by the differential sense amp 666 with Vref-read. However, in step 1452, Vref-read is the second reference voltage and has a different magnitude than Vref-read in step 1446. The different magnitude of Vref-read may be used to compensate for differences between the modules.

In some embodiments, the first and second reference signals that are used to compensate for differences between modules are reference currents. These reference currents may be compared to a current of the memory cell. FIG. 15 is a flowchart of one embodiment of a process 1500 of reading memory cells. The process 1500 provides further details for an embodiment of process 1100 in FIG. 11. Process 1500 may be used to compensate for differences between modules having cross-point arrays. In process 1500 the first and second reference signals that are used to compensate for differences between modules are reference currents.

Step 1502 include sensing the group of memory cells in a first read to generate first sensed currents. In step 1502 the first sensed currents are generated in response to a signal applied to each respective memory cell. The signal may be a voltage applied across the memory cell. With respect to FIG. 6, the read voltage may be applied across the selected memory cell in each respective module. The read voltage is applied between the selected WL and the selected BL.

Step 1504 includes comparing the first sensed currents with a first reference current. With respect to FIG. 6, the current from the selected memory cell may be compared with Iref to generate Vsense, which is provided to the differential sense amp 666. Here, Iref is a first reference current having a first magnitude.

Step 1506 includes determining first read results based on a comparison of the first sensed currents with the first reference current. Step 1506 may include comparing the sensed voltages (Vsense) of the first reads with a reference voltage. With respect to FIG. 6, for each cell, Vsense is compared by the differential sense amp 666 with Vref-read.

Step 1508 include sensing the group of memory cells in a second read to generate second sensed currents. In step 1508 the sensed currents are generated in response to a signal applied to each respective memory cell. The signal may be a voltage applied across the memory cell similar to step 1502. Step 1510 includes comparing the second sensed currents with a second reference current. The second reference current has a different magnitude from the first reference current. The different magnitudes of the reference currents may be used to compensate for differences between the modules. With respect to FIG. 6, the current from the selected memory cell may be compared with Iref to generate Vsense, which is provided to the differential sense amp 666. Here, Iref is a second reference current having a second magnitude that is different from Iref in step 1504.

Step 1512 includes determining second read results based on a comparison of the second sensed currents with the second reference current. Step 1512 may include comparing the sensed voltages (Vsense) of the second reads with a reference voltage. With respect to FIG. 6, for each cell, Vsense is compared by the differential sense amp 666 with Vref-read. Here, Vref-read in step 1512 may have the same magnitude as Vref-read in step 1506. The different magnitudes of the reference currents (Iref) in steps 1504 and 1510 may be used to compensate for differences between the modules.

In some embodiments, different reference signals are applied to the memory cells to compensate for differences between the modules during read. In one embodiment, different read reference currents are driven through the memory cells to compensate for differences between the modules.

FIG. 16 is a flowchart of one embodiment of a process 1600 of reading memory cells. The process 1600 provides further details for an embodiment of process 1100 in FIG. 11. Process 1600 may be used to compensate for differences between modules having cross-point arrays. Process 1600 describes one embodiment of a forced-current read. Process 1600 will be described with reference to FIG. 7, but is not limited thereto.

Step 1602 include forcing a first read reference current through the respective memory cells. With respect to FIG. 7, Iread may be forced through each respective memory cell. In step 1602 Iread has a first magnitude. Step 1604 includes sensing voltages in response to forcing the read current through the respective memory cells to generate first sense signals. With respect to FIG. 7, the voltage at VXSP is sensed and provided to the differential sense amp 704. Step 1606 includes determining first read results based on the first sense signals. With respect to FIG. 7, the voltage at VXSP is compared by the differential sense amp 704 with Vref.

Step 1608 include forcing a second read reference current through the respective memory cells. With respect to FIG. 7, Iread may be forced through each respective memory cell. In step 1608 Iread has a second magnitude (different from Iread in step 1602) in order to compensate for differences between modules. Step 1610 includes sensing memory cells in response to forcing the second read reference current through the respective memory cells to generate sense signals. With respect to FIG. 7, the voltage at VXSP is sensed and provided to the differential sense amp 704. Step 1612 includes determining second read results based on the second sensed signals. With respect to FIG. 7, the voltage at VXSP is compared by the differential sense amp 704 with Vref. Here, Vref may have the same magnitude in steps 1606 and 1612.

FIG. 17 is a flowchart of one embodiment of a process 1700 of reading memory cells. The process 1700 provides further details for an embodiment of process 1100 in FIG. 11. Process 1700 may be used to compensate for differences between modules having cross-point arrays. Process 1700 describes one embodiment of a forced-voltage read. Process 1700 will be described with reference to FIG. 6, but is not limited thereto.

Step 1702 include applying a first read reference voltage across the respective memory cells. With respect to FIG. 6, the first read reference voltage may be applied across the selected memory cell in each respective module. The first read reference voltage is applied between the selected WL and the selected BL. Step 1704 includes sensing each memory cell in response to the first read reference signal to generate first sense signals. With respect to FIG. 6, the current from the selected memory cell is compared with Iref to generate Vsense, which is provided to the differential sense amp 666. Step 1706 includes determining first read results based on the first sense signals. Step 1706 may include comparing the sensed voltages (Vsense) of the first reads with a reference voltage. With respect to FIG. 6, for each cell, Vsense is compared by the differential sense amp 666 with Vref-read.

Step 1708 include applying a second read reference voltage across the respective memory cells. With respect to FIG. 6, the second read reference voltage may be applied across the selected memory cell in each respective module. The second read reference voltage is applied between the selected WL and the selected BL. The second read reference voltage has a different magnitude than the first read reference voltage in step 1702 in order to compensate for differences between the modules. Step 1710 includes sensing each memory cell in response to the second read reference voltage to generate second sense signals. With respect to FIG. 6, the current from the selected memory cell is compared with Iref to generate Vsense, which is provided to the differential sense amp 666. Step 1712 includes determining second read results based on the second sense signals. Step 1712 may include comparing the sensed voltages (Vsense) of the first reads with a reference voltage. With respect to FIG. 6, for each cell, Vsense is compared by the differential sense amp 666 with Vref-read.

FIG. 18 is a schematic of one embodiment of a sense amplifier that may be used for single sampling in a two-step redundant read scheme. The sense amplifier may be used to sense a memory cell 1806. In an embodiment, the memory cell 1806 is a programmable resistance cell such as MRAM, ReRam, PCM (Phase Change Memory), or FeRam. In one embodiment, the sense amplifier of FIG. 18 is used for sense amp 666 in FIG. 6. In one embodiment, the sense amplifier of FIG. 18 is used for sense amp 704 in FIG. 7.

Two input sense capacitors C1, C2 are connectable to an input of the sense amplifier at Node A. Sense capacitor C1 is connectable to Node A by switch S1. Sense capacitor C2 is connectable to Node A by switch S2. Node A connects to the memory cell 1806 through transistors T7 and T8. In an embodiment, to sense the memory cell 1806 the voltage at Node A is sampled and stored by both sense capacitors C1 and C2. The gate of transistor T1 is connected to capacitor C3. In an embodiment, C1 and C2 have the same capacitance. C3 may have a significantly smaller capacitance than C1 and C2. The charge on C1 is shared with C3 by closing S1 and S3 (S4 open). Alternatively, the charge on C2 is shared with C3 by closing S2 and S4 (S3 open). By sizing C3 as a significantly smaller capacitance than C1 (or alternatively C2) C3 will have a small, or even negligible, impact on the final node voltage at the gate of T1.

The sense amplifier has two reference capacitors C5 and C6, which allows a choice of two different reference voltages. Switch S5 is closed (S7 open) to store a reference voltage on C5. Switch S6 is closed (S8 open) to store a reference voltage on C6. C5 and C6 may be the same size, but that is not required. S5 and S7 are closed to charge C4 based on the reference voltage on C5 (S8 is open). At a different point in time S6 and S6 are closed to charge C4 based on the reference voltage on C6 (S7 is open). In an embodiment, C5 and C6 have the same capacitance. C4 may have a significantly smaller capacitance than C5 and C6. The charge on C5 is shared with C4 by closing S5 and S6 (S8 open). Alternatively, the charge on C6 is shared with C4 by closing S6 and S8 (S7 open). By sizing C4 as a significantly smaller capacitance than C5 (or alternatively C6) C4 will have a small, or even negligible, impact on the final node voltage at the gate of T2.

The sense amplifier has a differential sense circuit that includes transistors T1, T2, T2, T4, T5, and T6. The differential sense circuit has a sense input at the gate of transistor T1 and a reference input at the gate of transistor T2. The differential sense circuit compares the voltage on C3 with the voltage on C4. A result may be latched by transistors T3, T4, T5, and T6. This result may be transferred to the sense latch 1802. Transistors T3, T4, T5, and T6 may be referred to as a second stage 1804. The second stage 1804 is reset between sense operations.

To set up the first read, S9 and S10 are closed, wherein C3 and C4 are each charged to a known voltage "vnnq". Then, S9 and S10 are opened to float the sense input node and the sense ref node. Then S1, S3, S5, and S7 are closed. Therefore, charge sharing occurs between C1 and C3. Also, charge sharing occurs between C5 and C4. The capacitors are sized as discussed above such that C3 and C4 have a small, or even negligible, impact on the final node voltages. The sense amplifier then produces a first sensing result, which may be latched in sense latch 1802. The second stage 1804 is then reset prior to another sense operation.

For the second sense operation, S1, S3, S5, and S are opened. To set up the second read, S9 and S10 are closed, wherein C3 and C4 are each charged to the known voltage "vnnq". Then, S9 and S10 are opened to float the sense input node and the sense ref node. Then S2, S4, S6, and S6 are closed. Therefore, charge sharing occurs between C2 and C3. Also, charge sharing occurs between C6 and C4. Note the second reference voltage derived from C6 has a different magnitude than the first reference voltage derived from C5. The capacitors are sized as discussed above such that C3 and C4 have a small, or even negligible, impact on the final node voltages. The differential sense circuit then produces a second sensing result, which may be latched in sense latch 1802. After sensing, S2, S4, S6, and S6 are opened and S9 and S10 are closed to drive the sense inputs to a known state.

In an embodiment, one reference capacitor C5 is used in step 1102 in FIG. 11 and the other reference capacitor C6 in step 1104. In an embodiment, one reference capacitor C5 is used in step 1426 in FIG. 14A and the other reference capacitor C6 in step 1432. In an embodiment, one reference capacitor C5 is used in step 1446 in FIG. 14B and the other reference capacitor C6 in step 1452.

In one embodiment, the input capacitors C1, C2 are used to avoid a redundant sense of the memory cell 1806 when two reads of the cell 1806 are performed closed in time. For example, the cell 1806 is sensed in a first read with a voltage stored on both input capacitors C1, C2. One input capacitor C1 is first used to charge C3. The voltage on C3 is compared with the voltage on C4 with the voltage on C4 provided in any manner.) After resetting the second stage 1804, the other input capacitor C2 is used to charge C3. The voltage on C3 is compared with the voltage on C4 (with the voltage on C4 provided in any manner.) The voltage on C4 could be the same or different as the first sensing read. One option is to only perform the second read if the first read fails. Thus, the second read is faster by not having to sense the memory cell 1806 again for the second read. The two reads could be both be fast reads. A fast read compares the voltage sensed from the cell 1806 with a reference voltage that does not depend on the state of the cell. One read could be a fast read and the other a self-referenced read (SRR). A SRR first reads the cell and saves the sense result, then writes the cell to a known state, then senses the cell again with the second sense result compared to the first sense result. In an embodiment, time is saved in a SRR that follows a fast read by storing the sense result from the fast read on both input capacitors C1, C2, using the voltage on C1 for the fast read, and then using the voltage on C2 for the first read of the SRR. Thus, the cell need not be sensed again for the first read of the SRR. Still another option is to perform back-to-back SRRs with the input capacitors C1, C2 being used to store a voltage from the first read of the first SRR. Then, C1 may be used to provide the voltage to C3 for the first read of the first SRR and C2 may be used to provide the voltage to C3 for the first read of the second SRR.

One embodiment of the disclosed technology includes an apparatus comprising a control circuit configured to communicate with cross-point memory arrays. Each cross-point memory array has programmable resistance memory cells. The control circuit is configured to perform a first read of at least a first subset of a group of the memory cells that store one or more error correcting code (ECC) codewords. Each memory cell in the group is in a different cross-point memory array. The first read is performed using a first reference signal to generate first read results. The control circuit is configured to perform a second read of at least a second subset of the group of memory cells using a second reference signal instead of the first reference signal to generate second read results. The second reference signal has a different magnitude than the first reference signal. The control circuit is configured to form final read results for the group that includes the first read results for memory cells in the first subset and the second read results for memory cells in the second subset.

In a further embodiment, the control circuit is further configured to apply an error correction algorithm to the final read results to decode the one or more ECC codewords.

In a further embodiment, the control circuit is further configured to perform the first read of the entire group of the memory cells using the first reference signal. And the control circuit is further configured to replace the first read results for memory cells the second subset with the second read results for memory cells the second subset to form the final read results.

In a further embodiment, the control circuit is further configured to apply an error correction algorithm to the first read results of the entire group of the memory cells. And the control circuit is further configured to perform the second read of the at least the second subset of the group of memory cells using the second reference signal instead of the first reference signal responsive to a failure to decode the first read results of the entire group of the memory cells.

In a further embodiment, the control circuit is further configured to apply an error correction algorithm to the first read results of the entire group of the memory cells. And the control circuit is further configured to perform the second read of the at least the second subset of the group of memory cells using the second reference signal instead of the first reference signal prior to completion of the error correction algorithm.

In a further embodiment, the control circuit is further configured to: sense the at least the first subset of the group to generate sense signals in the first read; store the sense signals on a first set of capacitors and a second set of capacitors; compare the sense signals from the first set of capacitors to the first reference signal to generate the first read results; and compare the sense signals from the second set of capacitors to the second reference signal to generate the second read results.

In a further embodiment, the first reference signal comprises a first reference voltage having a first magnitude and the second reference signal comprises a second reference voltage having a second magnitude different from the first magnitude. And the control circuit is further configured to: sense the at least the first subset of the group in the first read to generate sense voltages; store the sense voltages on a first set of capacitors and a second set of capacitors; compare the sense voltages from the first set of capacitors with the first reference voltage to generate the first read results; and compare the sense voltages from the second set of capacitors with the second reference voltage to generate the second read results.

In a further embodiment, the control circuit is further configured to: store the first reference voltage on a third set of capacitors; store the second reference voltage on a fourth set of capacitors. For each respective memory cell in the at least the first subset of the group the control circuit is further configured to: input the sense voltage from a capacitor in the first set to a first input of a differential sense circuit associated with the respective memory cell; input the first reference voltage from a capacitor in the third set to a second input of the differential sense circuit associated with the respective memory cell; and generate the first read results based on a comparison of the sense voltage at the first input with the first reference voltage at the second input. For each memory cell in the at least the first subset of the group the control circuit is further configured to: input the sense voltage from a capacitor in the second set to the first input of the differential sense circuit associated with the respective memory cell; input the second reference voltage from a capacitor in the fourth set to the second input of the sense amplifier associated with the respective memory cell; and generate the second read results based on a comparison of the sense voltage at the first input with the second reference voltage at the second input.

In a further embodiment, the first reference signal comprises a first reference current having a first magnitude and the second reference signal comprises a second reference current having a second magnitude different from the first magnitude. And the control circuit is further configured to: sense the at least the first subset of the group in the first read to generate first sense currents; compare the first sense currents with the first reference current; determine the first read results based on the comparison of the first sense currents with the first reference current; sense the at least the second subset of the group in the second read to generate second sense currents; compare the second sense currents with the second reference current; and determine the second read results based on the comparison of the second sense currents with the second reference current.

In a further embodiment, the control circuit is further configured to: apply the first reference signal to the at least the first subset of the group to generate first sense signals in the first read; determine the first read results based on the first sense signals; apply the second reference signal to the at least the second subset of the group generate second sense signals in the second read; and determine the second read results based on the second sense signals.

In a further embodiment, the first reference signal comprises a first read reference current having a first magnitude and the second reference signal comprises a second read reference current having a second magnitude different from the first magnitude. And the control circuit is further configured to: drive the first read reference current through each respective memory cell in the at least the first subset of the group; sense each respective memory cell in the at least the first subset of the group responsive to applying the first read reference current to generate first sense signals; determine the first read results based on the first sense signals; drive the second read reference current through each respective memory cell in the at least the second subset of the group; sense each respective memory cell in the at least the second subset of the group responsive to applying the second read reference current to generate second sense signals; and determine the second read results based on the second sense signals.

In a further embodiment, the first reference signal comprises a first read reference voltage having a first magnitude and the second reference signal comprises a second read reference voltage having a second magnitude different from the first magnitude. And the control circuit is further configured to: apply the first read reference voltage across each respective memory cell in the at least the first subset of the group; sense each respective memory cell in the at least the first subset of the group responsive to applying the first read reference voltage to generate first sense signals; determine the first read results based on the first sense signals; apply the second read reference voltage across each respective memory cell in the at least the second subset of the group; sense each respective memory cell in the at least the second subset of the group responsive to applying the second read reference voltage to generate second sense signals; and determine the second read results based on the second sense signals.

In a further embodiment, the memory cells in each cross-point array share a common set of addresses within the respective cross-point array. And each memory cell in the group has the same address with their respective cross-point array.

One embodiment includes a method for reading memory cells. The method comprise sensing a group of programmable resistance memory cells on a memory die to generate first sensing results. The memory die has a plurality of modules of programmable resistance memory cells. The memory cells in each respective module share a common set of addresses within the respective module. Each cell in the group has the same address in a different module. The method comprises comparing the first sensing results with a first reference signal to generate first read results. The method comprises sensing at least a subset of the group to generate second sensing results. The method comprises comparing the second sensing results with a second reference signal to generate second read results. The second reference signal has a different magnitude than the first reference signal. The method comprises replacing the first read results for memory cells in the subset with the second read results for the memory cells in the subset to generate final read results. The method comprises applying an error correction algorithm to the final read results.

One embodiment includes a memory system comprising a plurality of modules and a control circuit in communication with the plurality of modules. Each module has a cross-point array. Each cross-point array has a set of word lines, a set of bit lines, and programmable resistance memory cells. Each programmable resistance memory cell resides at a cross-point of a word line and a bit line. Each programmable resistance memory cell's physical location is defined by the cross-point of the word line and the bit line to which the cell is connected. The control circuit is configured to sense a group of the memory cells that have the same relative physical locations in their respective cross-point arrays to generate first sensing results. The control circuit is configured to compare the first sensing results with a first reference signal to generate first read results. The control circuit is configured to sense a subset of the group of the memory cells to generate second sensing results. The control circuit is configured to compare the second sensing results with a second reference signal to generate second read results. The second reference signal has a different magnitude than the first reference signal. The control circuit is configured to replace results for the subset of the memory cells in the first read results with corresponding results for the subset of the memory cells in the second read to generate final read results. The control circuit is configured to apply an error correction algorithm to the final read results.

For purposes of this document, each process associated with the disclosed technology may be performed continuously and by one or more computing devices. Each step in a process may be performed by the same or different computing devices as those used in other steps, and each step need not necessarily be performed by a single computing device.

For purposes of this document, reference in the specification to "an embodiment," "one embodiment," "some embodiments," or "another embodiment" are used to described different embodiments and do not necessarily refer to the same embodiment.

For purposes of this document, a connection can be a direct connection or an indirect connection (e.g., via another part).

For purposes of this document, the term "set" of objects, refers to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An apparatus, comprising:

a control circuit configured to communicate with cross-point memory arrays, each cross-point memory array having programmable resistance memory cells, the control circuit configured to:

perform a first read of a group of the memory cells that store one or more error correcting code (ECC) codewords, wherein each memory cell in the group is in a different cross-point memory array, the first read performed using a first reference signal to generate first read results for the group, the group includes a first subset of the group and a second subset of the group;

apply an error correction algorithm to the first read results;

provide decoded data to a host responsive to successfully decoding the first read results with the error correction algorithm;

perform a second read of at least the second subset of the group of memory cells using a second reference signal instead of the first reference signal to generate second read results, the second reference signal having a different magnitude than the first reference signal;

replace the first read results for the memory cells in the second subset with the second read results for the memory cells in the second subset to form final read results for the group that includes the first read results for memory cells in the first subset and the second read results for memory cells in the second subset;

apply the error correction algorithm to the final read results if decoding the first read results failed; and provide decoded data to the host responsive to successfully decoding the final read results with the error correction algorithm.

2. The apparatus of claim 1, wherein the control circuit is further configured to:

initiate the second read of the at least the second subset of the group of memory cells using the second reference signal instead of the first reference signal responsive to determining that decoding the first read results with the error correction algorithm failed.

3. The apparatus of claim 1, wherein the control circuit is further configured to:

initiate the second read of the at least the second subset of the group of memory cells using the second reference signal instead of the first reference signal prior to completion of the applying the error correction algorithm to the first read results, wherein the second read results are:

i) discarded responsive to successfully decoding the first read results with the error correction algorithm;

ii) used to replace the first read results for the memory cells in the second subset with the second read results for the memory cells in the second subset to form the final read results responsive to failure to decode the first read results with the error correction algorithm.

4. The apparatus of claim 1, wherein the control circuit is further configured to:

sense the group to generate sense signals;

store the sense signals on a first set of capacitors and a second set of capacitors;

compare the sense signals from the first set of capacitors to the first reference signal to generate the first read results; and compare the sense signals from the second set of capacitors to the second reference signal to generate the second read results.

5. The apparatus of claim 1, wherein:

the first reference signal comprises a first reference voltage having a first magnitude;

the second reference signal comprises a second reference voltage having a second magnitude different from the first magnitude; and the control circuit is further configured to:

sense the group to generate sense voltages;

store the sense voltages on a first set of capacitors and a second set of capacitors;

compare the sense voltages from the first set of capacitors with the first reference voltage to generate the first read results; and compare the sense voltages from the second set of capacitors with the second reference voltage to generate the second read results.

6. The apparatus of claim 5, wherein the control circuit is further configured to:

store the first reference voltage on a third set of capacitors;

store the second reference voltage on a fourth set of capacitors;

for each respective memory cell in the group:

input the sense voltage from a capacitor in the first set to a first input of a differential sense circuit associated with the respective memory cell;

input the first reference voltage from a capacitor in the third set to a second input of the differential sense circuit associated with the respective memory cell; and generate the first read results based on a comparison of the sense voltage at the first input with the first reference voltage at the second input; and for each memory cell in the group:

input the sense voltage from a capacitor in the second set to the first input of the differential sense circuit associated with the respective memory cell;

input the second reference voltage from a capacitor in the fourth set to the second input of the differential sense circuit associated with the respective memory cell; and generate the second read results based on a comparison of the sense voltage at the first input with the second reference voltage at the second input.

7. The apparatus of claim 1, wherein:

the first reference signal comprises a first reference current having a first magnitude;

the second reference signal comprises a second reference current having a second magnitude different from the first magnitude; and the control circuit is further configured to:

sense the group in the first read to generate first sense currents;

compare the first sense currents with the first reference current;

determine the first read results based on the comparison of the first sense currents with the first reference current;

sense the at least the second subset of the group in the second read to generate second sense currents;

compare the second sense currents with the second reference current; and determine the second read results based on the comparison of the second sense currents with the second reference current.

8. The apparatus of claim 1, wherein the control circuit is further configured to:

apply the first reference signal to the group to generate first sense signals in the first read;

determine the first read results based on the first sense signals;

apply the second reference signal to the at least the second subset of the group to generate second sense signals in the second read; and determine the second read results based on the second sense signals.

9. The apparatus of claim 1, wherein:

the first reference signal comprises a first read reference current having a first magnitude;

the second reference signal comprises a second read reference current having a second magnitude different from the first magnitude;

the control circuit is further configured to:

drive the first read reference current through each respective memory cell in the group;

sense each respective memory cell in the group responsive to applying the first read reference current to generate first sense signals;

determine the first read results based on the first sense signals;

drive the second read reference current through each respective memory cell in the at least the second subset of the group;

sense each respective memory cell in the at least the second subset of the group responsive to applying the second read reference current to generate second sense signals; and determine the second read results based on the second sense signals.

10. The apparatus of claim 1, wherein:

the first reference signal comprises a first read reference voltage having a first magnitude;

the second reference signal comprises a second read reference voltage having a second magnitude different from the first magnitude; and the control circuit is further configured to:

apply the first read reference voltage across each respective memory cell in the group;

sense each respective memory cell in the group responsive to applying the first read reference voltage to generate first sense signals;

determine the first read results based on the first sense signals;

apply the second read reference voltage across each respective memory cell in the at least the second subset of the group;

sense each respective memory cell in the at least the second subset of the group responsive to applying the second read reference voltage to generate second sense signals; and determine the second read results based on the second sense signals.

11. The apparatus of claim 1, wherein:

the memory cells in each cross-point array share a common set of addresses within the respective cross-point array; and each memory cell in the group has the same address with their respective cross-point array.

12. A method for reading memory cells, the method comprising:

sensing a group of programmable resistance memory cells on a memory die to generate first sensing results, the memory die having a plurality of modules of programmable resistance memory cells, the memory cells in each respective module sharing a common set of addresses within the respective module, each cell in the group having the same address in a different module, the group of programmable resistance memory cells store one or more error correcting code (ECC) codewords;

comparing the first sensing results with a first reference signal to generate first read results;

providing the first read results to an ECC engine;

determining that decoding the first read results failed responsive to the ECC engine failing to successfully decode the first read results;

sensing at least a subset of the group to generate second sensing results;

comparing the second sensing results with a second reference signal to generate second read results, the second reference signal having a different magnitude than the first reference signal;

replacing the first read results for memory cells in the subset with the second read results for the memory cells in the subset to generate final read results;

providing the final read results to the ECC engine; and providing successfully decoded data for the one or more ECC codewords to a host responsive to the ECC engine successfully decoding the final read results.

13. The method of claim 12, wherein:

sensing the at least the subset of the group is performed in parallel with applying an error correction algorithm by the ECC engine to the first read results.

14. The method of claim 12, wherein:

the first reference signal is a first reference voltage having a first magnitude; and the second reference signal is a second reference voltage having a second magnitude that is different from the first magnitude.

15. A memory system, comprising:

a plurality of cross-point memory arrays, each cross-point memory array having programmable resistance memory cells;

a first set of capacitors and a second set of capacitors, there being a capacitor in the first set and a capacitor in the second set for each cross-point memory array; and one or more control circuits in communication with the plurality of cross-point memory arrays, the first set of capacitors and the second set of capacitors, the one or more control circuits configured to:

sense a group of the memory cells that store one or more error correcting code (ECC) codewords to generate sense signals, wherein each memory cell in the group is in a different cross-point memory array of the plurality of cross-point memory arrays, the group of the memory cells includes a first subset and a second subset;

store the sense signals on the first set of capacitors and the second set of capacitors;

compare the sense signals from the first set of capacitors to a first reference signal to generate first read results;

compare the sense signals from the second set of capacitors to a second reference signal to generate second read results, the second reference signal having a different magnitude than the first reference signal; and form final read results for the group that includes the first read results for memory cells in the first subset and the second read results for memory cells in the second subset.

* * * * *